United States Patent
Sommer et al.

(10) Patent No.: US 6,876,025 B2
(45) Date of Patent: Apr. 5, 2005

(54) DRAM CELL AND SPACE-OPTIMIZED MEMORY ARRAY

(75) Inventors: Michael Sommer, Raubling (DE); Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/462,513

(22) Filed: Jun. 16, 2003

(65) Prior Publication Data

US 2004/0007726 A1 Jan. 15, 2004

(30) Foreign Application Priority Data

Jun. 14, 2002 (DE) .......................................... 102 26 660

(51) Int. Cl.[7] .............................................. H01L 27/108
(52) U.S. Cl. ...................... 257/296; 257/300; 257/301; 257/328; 257/329; 257/334
(58) Field of Search ................................ 257/296, 300, 257/301, 328, 329, 334, 311, 304, 305

(56) References Cited

U.S. PATENT DOCUMENTS

| | | | |
|---|---|---|---|
| 6,410,391 B1 * | 6/2002 | Zelsacher | 438/259 |
| 6,448,600 B1 | 9/2002 | Schlösser et al. | |
| 6,521,935 B2 * | 2/2003 | Krautschneider et al. | 257/296 |
| 2003/0062555 A1 * | 4/2003 | Miyai et al. | 257/296 |
| 2003/0169629 A1 * | 9/2003 | Goebel et al. | 365/200 |

FOREIGN PATENT DOCUMENTS

DE       199 54 867 C1       12/2000

\* cited by examiner

*Primary Examiner*—Minhloan Tran
*Assistant Examiner*—Tan Tran

(74) *Attorney, Agent, or Firm*—Laurence A. Greenberg; Werner H. Stemer; Ralph E. Locher

(57) ABSTRACT

The memory cell according to the invention has a vertical selection transistor, via whose channel region the inner electrode of the trench capacitor can be connected to a bit line. The channel region is led to the bit line through an associated word line, which completely or partially encloses the channel region. As a result, a conductive channel can be formed within the channel region depending on the potential of the word line. Preferably, the extent of the trench hole in the word line direction is at least 1.5 times as large as in the bit line direction.

25 Claims, 15 Drawing Sheets

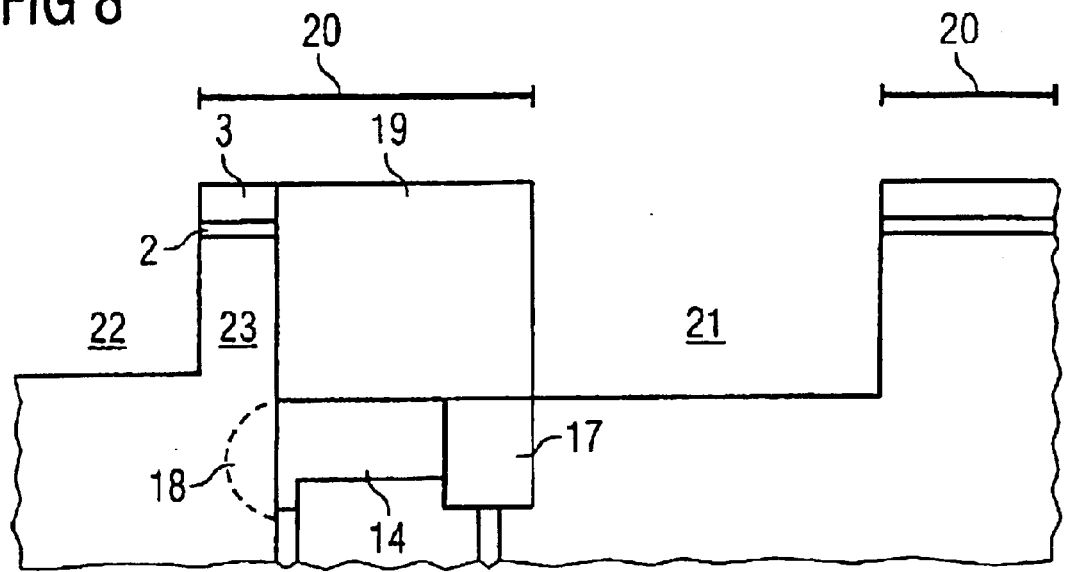
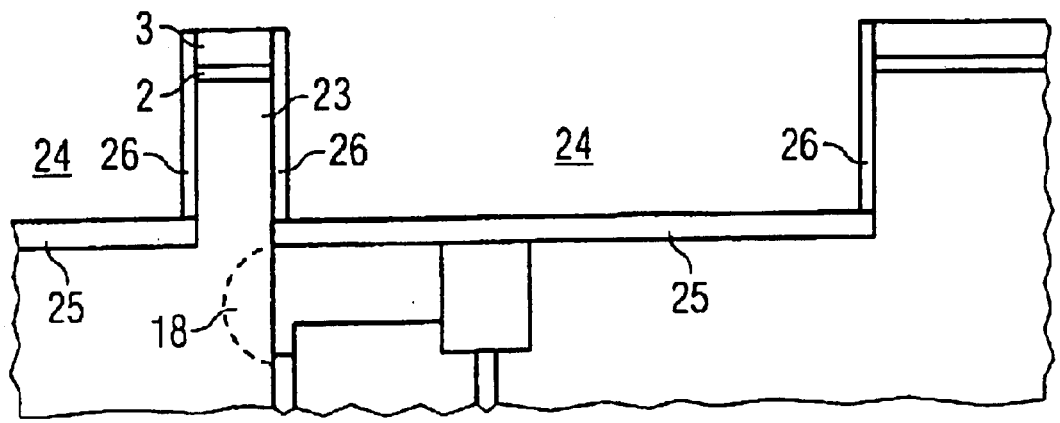

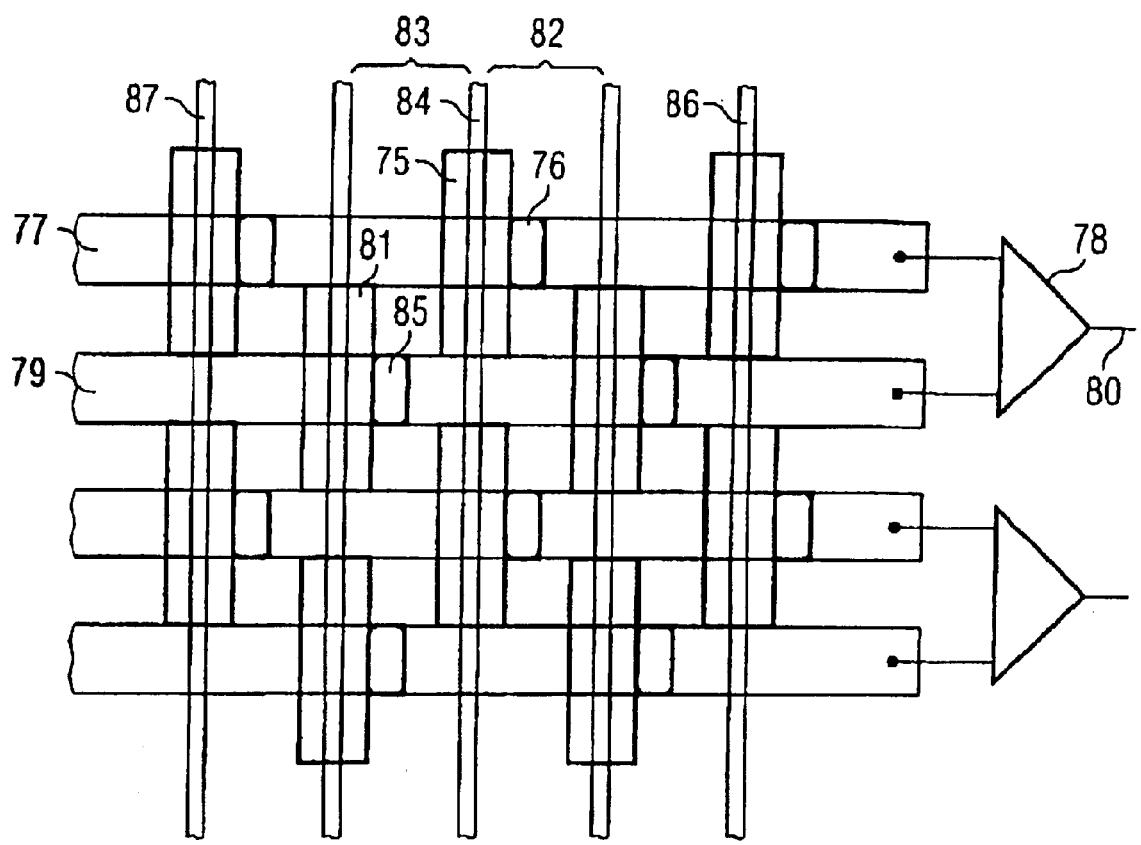

DRAM CELL AND SPACE-OPTIMIZED MEMORY ARRAY

BACKGROUND OF THE INVENTION

Field of the Invention

The invention relates to a memory cell and a memory cell array.

With the aid of semiconductor memory cells, information can be stored in the form of a charge and the information can be subsequently read out. A memory cell of a DRAM semiconductor memory comprises a trench capacitor and also a selection transistor. A charge representing the information to be stored is stored in the trench capacitor. If the selection transistor of the memory cell is activated by means of the associated word line, then the stored charge is transferred to a bit line of the semiconductor memory. The voltage of the bit line can be evaluated by way of an evaluation circuit, so that the charge stored in the trench capacitor can be detected as information.

In order, in the context of structures becoming ever smaller, to be able to realize, for example, a DRAM memory cell with a small area requirement, concepts with a selection transistor that is arranged vertically are increasingly being investigated.

Commonly assigned U.S. Pat. No. 6,448,600 B1 and its corresponding German patent DE 199 54 867 C1 disclose a DRAM cell configuration and a method for fabricating it, in which a vertical selection transistor is provided. The known cell configuration has a trench capacitor connected to a horizontally arranged source/drain region in the upper end region. A lower source/drain region connected to a vertical connection channel is formed in a manner offset with respect to the upper source/drain region. The connection channel is led upward from the lower source/drain region to the bit line. A gate region is formed parallel to the connection channel, the gate region constituting part of a word line. The known cell configuration has the disadvantage that a relatively large amount of area is required for the formation of the memory cell.

SUMMARY OF THE INVENTION

It is accordingly an object of the invention to provide a space-optimized array configuration for DRAM memory cells which overcomes the above-mentioned disadvantages of the heretofore-known devices and methods of this general type and which provides for a memory cell and a memory cell array that enables a further reduction in the space required by it, yet provides for reliable storage of digital information.

With the foregoing and other objects in view there is provided, in accordance with the invention, a memory cell, comprising:

a substrate formed with a substantially rectangular trench hole defining a lower region and an upper region, and a horizontal bit line extending in a bit line direction;

a trench capacitor formed at the lower region of the trench hole, the trench capacitor having:

an inner capacitor electrode formed within the trench hole, an outer capacitor electrode formed outside the trench hole, and a dielectric layer between the inner capacitor electrode and the outer capacitor electrode;

a vertical selection transistor formed at the upper region of the trench hole, the selection transistor having:

a first source/drain electrode connected to the inner capacitor electrode of the trench capacitor, a second source/drain electrode connected to the horizontal bit line, and a vertically running channel region between the first source/drain electrode and the second source/drain electrode;

a horizontally running word line with gate region laterally adjoining the channel region, partially or completely enclosing the channel region, and being electrically insulated therefrom;

the vertically running channel region of the selection transistor extending through the horizontally running word line with gate region to the bit line above the channel region.

In other words, the memory cell according to the invention has a trench capacitor arranged in the lower region of an essentially rectangular trench hole. The trench capacitor comprises an inner electrode and also an outer counter-electrode, a dielectric layer being arranged between the inner electrode and the outer counter-electrode. In addition, the memory cell has a vertical selection transistor, via whose channel region the inner electrode of the trench capacitor can be connected to a bit line. In the memory cell according to the invention, the channel region is led through an associated word line to the bit line, the associated word line completely or at least partially enclosing the channel region. In this case, a conductive channel can be formed within the channel region depending on the potential of the associated word line.

In the solution according to the invention, the channel region is led through the associated word line in such a way that the channel region is completely or partially enclosed by the word line. What can be achieved with the aid of this geometry is that the channel region fulfils a dual function: firstly, the channel region serves as a source/drain path of the vertical selection transistor. In contrast to conventional field-effect transistors, the source/drain region in this case is enclosed preferably from all sides by the word line acting as gate electrode. The potential of the associated word line can be used to control whether or not a conductive channel is formed in the channel region. Through activation of the word line, the channel region can be transferred into the conductive state and then connects the interior of the trench capacitor to the associated bit line. The channel region thus additionally fulfils a second function and also serves as a switchable bit line contact connection. The solution according to the invention of leading the channel region through the associated word line to the bit line constitutes the simplest possible implementation of a vertical selection transistor. The "surrounded gate transistor" obtained in the solution according to the invention has a high current yield in the channel region owing to the peripherally arranged gate electrode, thus enabling the memory cell to be written to and read from rapidly.

It is advantageous if the extent of the trench hole in the word line direction is at least 1.5 times as large as the extent of the trench hole in the bit line direction. The greater the difference between the length and the width of the trench hole given a constant basic area, the larger the periphery of the trench hole becomes. The capacitance of the trench capacitor primarily depends on the periphery, and, in this respect, relatively large trench capacitances can be realized with a small basic area in this way. Large capacitances can store digital information more reliably than small capacitances. A further advantage is that a larger etching depth can be obtained with the aid of rectangular trench holes than with square trench holes. A further advantage when using rectangular trench holes is that the word lines can be made relatively narrow, which enables a space-saving construction.

In particular, it is advantageous if the extent of the longitudinal side of the trench hole is 2 to 3.5 times as large as the minimum resolution width F of the lithography used, and that the extent of the end side of the trench hole approximately corresponds to the minimum resolution width F. The end side is thus patterned as narrow as possible in order to attain a trench hole packing density that is as high as possible.

In accordance with an advantageous embodiment of the invention, the channel region is formed as a silicon needle which is led through the associated word line.

The silicon needles on the one hand serve as channel regions of the vertical selection transistors, and on the other hand the contact between the trench cell and the associated bit line is produced via the silicon needles. Bit line contact connections, as were used in the solutions of the prior art in order to make contact with the source/drain regions of the selection transistor, are no longer necessary in the solution according to the invention. As a result, the entire space available in the plane of the buried word lines can be used for the word lines themselves. Moreover, the entire construction of the cell is simplified, which will be advantageous in the context of further miniaturization. Furthermore, the process yield was greatly impaired precisely by defects in the patterning of the bit line contact connections used in the prior art.

It is advantageous if a gate oxide layer is arranged between the silicon needle and the associated word line which completely or at least partially encloses the silicon needle.

A "surrounded gate transistor" can be formed in this way, in which the silicon needle is surrounded from all sides by the word line acting as gate electrode. The cell can be written to and read from rapidly via the conductive channel that can be produced in this way.

In particular, it is advantageous if the cross-sectional area of the silicon needles amounts to between 0.5 F×1 F and 1 F×1 F, where denotes the minimum resolution width of the lithography used. The cross-sectional area must be large enough to be able to transport the charge rapidly into the capacitance and out of the capacitance. The dimensioning specified makes it possible to achieve a current yield which allows the cell to be written to and read from rapidly.

It is advantageous if the channel region is led to the bit line through the associated word line from a buried strap region connected to the inner electrode of the trench capacitor. The connection between the channel region and the inner electrode of the trench capacitor is produced via the n-doped buried strap region.

The memory cell array according to the invention comprises a multiplicity of memory cells of the type described above.

In this case, it is advantageous, in particular, if the trench holes are arranged offset relative to one another as seen in the bit line direction. This enables a very regular structure in which the distances between the trench cells reach their maximum. The structure thus obtained is very robust in the event of relatively small alignment errors and process inaccuracies. A further advantage is that, when using this structure, the trench holes can be enlarged further by wet-chemical afteretching (so-called "bottling"), as a result of which the capacitance of the trench cells is increased. As a result, the information to be stored can still be stored reliably even with small structural dimensions.

As an alternative to this, it is advantageous if the trench holes are arranged offset pairwise relative to one another as seen in the bit line direction. Since the structure thus obtained has often been used in the solutions of the prior art, it is for this structure that there is the most process experience.

In accordance with an advantageous embodiment of the invention, the channel regions in all the trench holes of the memory cell array are arranged at the same longitudinal side. This structure leads to relatively large distances between the individual channel regions, so that parasitic currents can largely be avoided here.

As an alternative to this, it is advantageous if the channel regions, as seen in the bit line direction, are arranged alternately at the first longitudinal side and at the second longitudinal side of the trench holes. This structure enables a compact arrangement of the insulating trenches situated below the covering oxide layer. A crosstalk between the different channel regions can be prevented with the aid of these insulating trenches.

It is advantageous if the channel regions in all the trench holes of the memory cell array are arranged at the same end side. Arranging the channel regions at the end sides of the trench holes enables the word lines to be patterned very narrow. Moreover, a "bulging" of the channel region, which is typical of channel regions arranged at the longitudinal side of the trench cell, is avoided in the case of this embodiment. Arranging the channel region at the end side of the trench hole results in a geometrically compact arrangement which still remains useable even with advancing miniaturization of the structures.

As an alternative to this, it is advantageous if the channel regions, as seen in the bit line direction, are arranged alternately at the first end side and at the second end side of the trench holes. A crosstalk between different channel regions can be reliably avoided in this solution as well.

In accordance with an advantageous embodiment of the invention, the bit lines are embodied as folded bit lines, the potential of an adjacent bit line in each case being used as reference potential for the read-out operation. Therefore, it is not necessary to provide an external reference potential, and the construction of the array of memory cells is simplified. A further advantage is that the bit lines do not have to be initialized with an external reference potential prior to the read-out, but rather only have to be momentarily short-circuited. The read-out operation is accelerated as a result.

As an alternative to this, it is advantageous if the bit lines are embodied as unfolded bit lines, an external potential in each case being used as reference potential for the read-out operation. When using the concept of the unfolded bit lines, each bit line is read for itself. Therefore, it is irrelevant if a channel region associated with the adjacent bit line is also activated by the respective word line. In comparison with the "folded bit line concept", the word lines in the case of the "open bit line concept" can therefore be made significantly wider and the conductivity of the word lines is increased.

In accordance with an advantageous embodiment of the invention, the word lines are realized as buried word lines arranged within recesses etched into the silicon substrate. Buried word lines have the advantage over word lines applied to the silicon substrate that the insulations can be patterned very simply relative to the trench holes situated underneath, relative to the adjacent word lines and also relative to the bit lines arranged above. A covering oxide layer serves to provide insulation from the trench holes, isolation trenches filled with insulating material serve to provide insulation from adjacent word lines, and a covering layer likewise serves to provide insulation from the bit lines arranged above the word lines. A further advantage is that buried word lines have a large cross section and, in this respect, also a good conductivity because the entire word line plane can be used for fabricating the word lines. The selection transistors can be activated rapidly on account of the high conductivity of such word lines.

In particular, it is advantageous if the word lines are composed of polysilicon. The use of polysilicon constitutes the cheapest and simplest solution in particular for wider word lines, for instance when using unfolded bit lines. Only few process steps are required for fabricating the word lines.

As an alternative to this, it is advantageous if the word lines are constructed in the form of a layer structure comprising a polysilicon layer, a tungsten layer and an insulating layer. With such a layer structure, it is possible to realize word lines which have a high conductivity even with a small width. Word lines with high conductivity can be activated more rapidly and thus enable short access times during write and read operations. One advantage of the proposed layer structure, moreover, is that polysilicon is used as "gate electrode material" directly around the channel region. The transition to tungsten takes place only at a certain distance from the channel region. As a result, the properties of the selection transistor remain unchanged.

It is advantageous if adjacent word lines are insulated from one another by isolation trenches for word line separation. During the etching of the isolation trenches, the covering oxide layer introduced into the recesses may serve as an etching stop.

Furthermore, it is advantageous if the width of the isolation trenches for word line separation is smaller than the minimum resolution width F of the lithography used. The use of a so-called spacer technique allows the fabrication of isolation trenches with a width which is less than the resolution of the lithography used. In this way, the word lines can be widened at the expense of the isolation trenches without the cell having to be enlarged overall for this purpose.

In accordance with an advantageous embodiment of the invention, the memory cell array has an insulating trench structure arranged below the buried word lines, the insulating trenches preventing parasitic currents between adjacent channel regions.

In accordance with an advantageous embodiment of the invention, the basic area of a memory cell amounts to either 2 F×4 F, that is to say 8 $F^2$, or 2.25 F×4 F, that is to say 9 $F^2$, where F denotes the minimum resolution width of the type of lithography that is employed in the fabrication process. Both when using folded bit lines and when using unfolded bit lines, very compact cell configurations can be realized with the layout variants according to the invention.

The method according to the invention for fabricating memory cells proceeds from a prepatterned substrate having a multiplicity of trench holes. A trench capacitor having an inner electrode, an outer counter-electrode and also a dielectric layer arranged between the inner electrode and the outer counter-electrode is respectively arranged in the lower region of a trench hole. In a first step, recesses for the word lines are etched into the prepatterned substrate, silicon needles being left laterally beside the trench holes. These silicon needles subsequently serve as channel regions of vertical selection transistors. Afterward, conductive material for fabricating buried word lines is introduced into the recesses.

Other features which are considered as characteristic for the invention are set forth in the appended claims.

Although the invention is illustrated and described herein as embodied in an area-optimized array arrangement for DRAM memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–9 are partial vertical sections illustrating method stages 1 through 9 in a fabrication method according to the invention;

FIG. 15C is a plan view showing the first layout variant of the invention, but with the unfolded bit line concept being realized;

DESCRIPTION OF THE PREFERRED EMBODIMENTS

Figure 1:
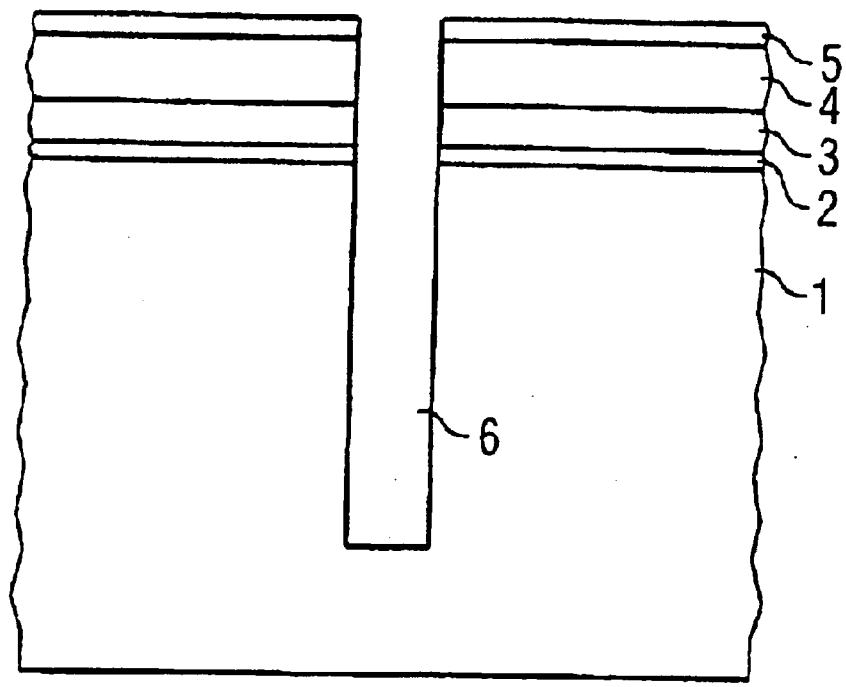

Referring now to the figures of the drawing in detail and first, particularly, to FIG. 1 thereof, a weakly p-doped silicon wafer serves as a starting point for the fabrication of an array of memory cells according to the invention. In a first step, the trench holes must be etched from the silicon. As illustrated, for this purpose an etching mask is applied to a silicon substrate 1. The etching mask preferably comprises a thermal oxide layer 2, a nitride layer 3, and also a further oxide layer 4, preferably made of borosilicate glass, deposited by way of chemical vapor deposition (CVD). While the thermal oxide layer 2 is only about 5 nm thick, the nitride layer 3 has a thickness of preferably 200 nm. The thickness of the oxide layer 4 is preferably approximately 1000 nm.

A photoresist layer 5 is applied to the etching mask (2, 3, 4), exposed by means of a lithography method, and subsequently etched. In this case, areas which essentially correspond to the cross-sectional area of a trench hole are etched from the photoresist. Afterward, both the layers 2, 3, 4 and the silicon substrate 1 are etched down to a predetermined depth in order to produce trench holes 6 in this way. This method state is shown in FIG. 1.

Figure 2:
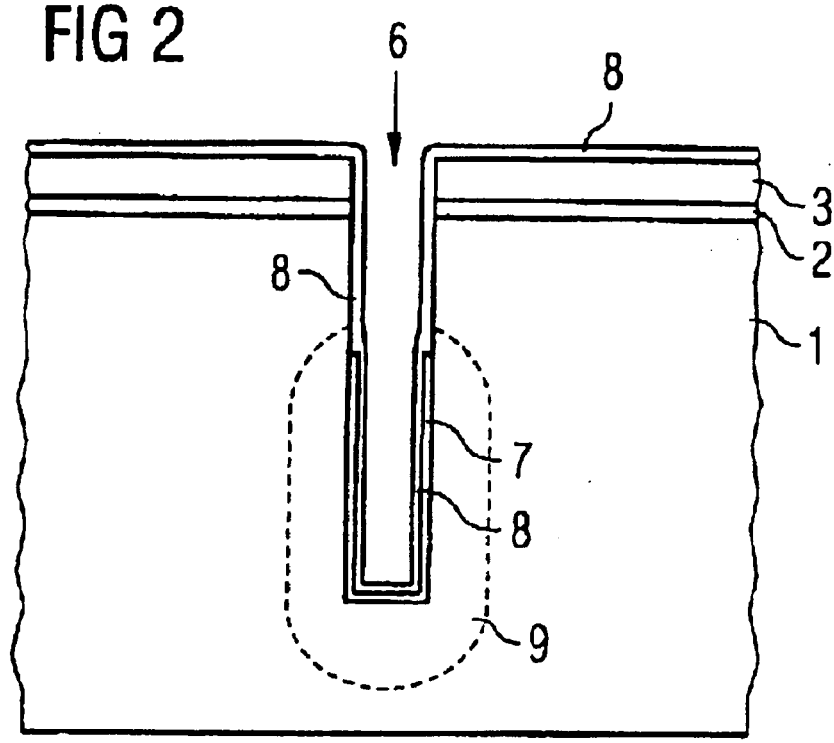

Both the photoresist layer 5 and the oxide layer 4 are removed again. The counter-electrode (buried plate) of the trench capacitor shall now be formed hereinafter. For this purpose, an arsenic-doped oxide layer 7 is deposited by means of CVD (chemical vapor deposition). Said arsenic-doped oxide layer 7 is then etched back down to a first depth in a first recess step. A further oxide layer 8 is then applied by means of CVD. In a subsequent outdiffusion process, an n-doped zone 9 is produced in the p-doped silicon substrate 1 in the vicinity of the arsenic-doped oxide layer 7 all around the lower trench region. The n-doped zone 9 is also referred to as a "buried plate" and serves as a counter-electrode of the trench capacitor. This method state is illustrated in FIG. 2.

Figure 3:
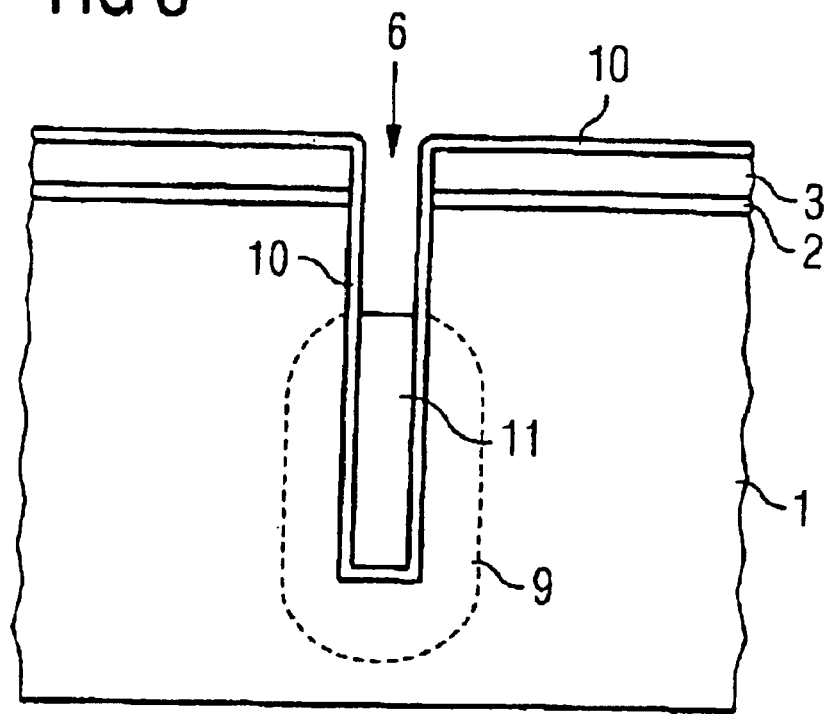

After the removal of the oxide layer 8 and the arsenic-doped oxide layer 7, a dielectric layer 10 is applied on the inside of the trench hole 6. The dielectric layer 10 is preferably a nitride oxide layer having a thickness of about 5 nm. The dielectric layer 10 subsequently serves as a dielectric of the storage capacitor. The lower region of the trench hole 6 is filled with a first polysilicon 11. For this purpose, firstly the entire trench hole 6 is filled with n-doped polysilicon, and then the polysilicon is etched back again down to the first depth. This method state is shown in FIG. 3.

The dielectric layer 10 can then be removed from the sidewalls of the trench hole 6 in the upper region of the trench hole, that is to say in the region above the first polysilicon 11. Next, a so-called collar oxide 12 is deposited on the sidewall of the trench hole by means of CVD in the region above the dielectric layer 10. The collar oxide 12 is preferably composed of silicon oxide. After the deposition, the collar oxide 12 is etched back anisotropically. The collar oxide 12, also referred to as "thick oxide", primarily serves for preventing parasitic currents between the n-doped zone 9 and the memory cell's selection transistor described further below.

Figure 4:
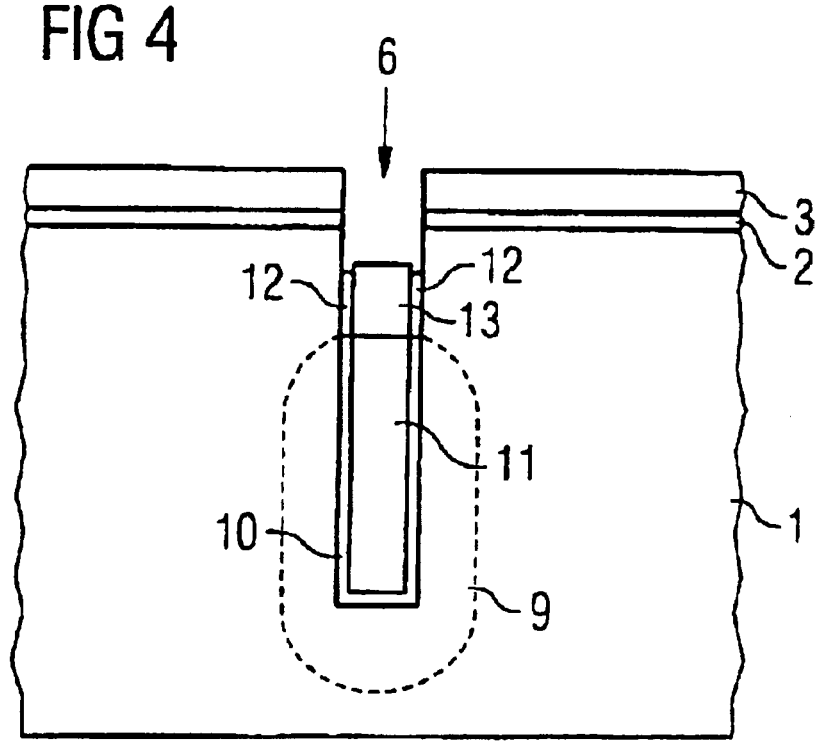

Next, a second polysilicon 13 is deposited into the trench hole 6 and subsequently etched back down to a second depth in a second recess step. Afterward, the collar oxide 12 is removed to below the upper edge of the second polysilicon 13. This method state is shown in FIG. 4.

Figure 5:
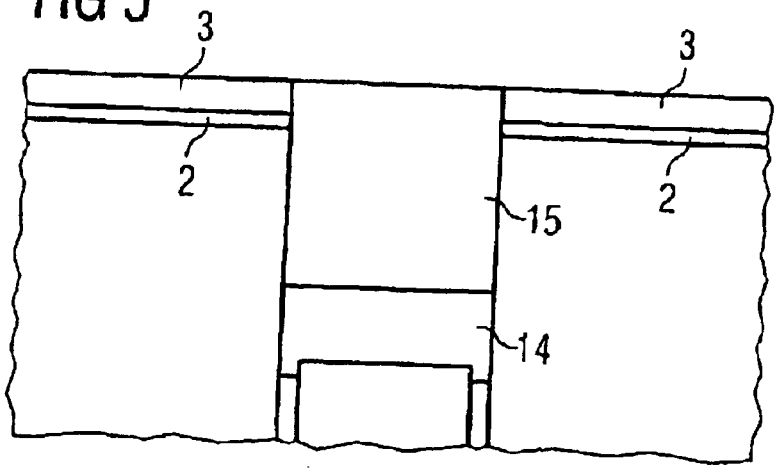

Proceeding from this method state, an n-doped third polysilicon 14 is deposited into the trench hole 6. Arsenic-doped polysilicon is preferably used in this case. In the subsequent third recess step, the third polysilicon 14 is etched back down to a third depth. The trench hole 6 is filled with a filling material 15. This method state is shown in FIG. 5.

Figure 6:
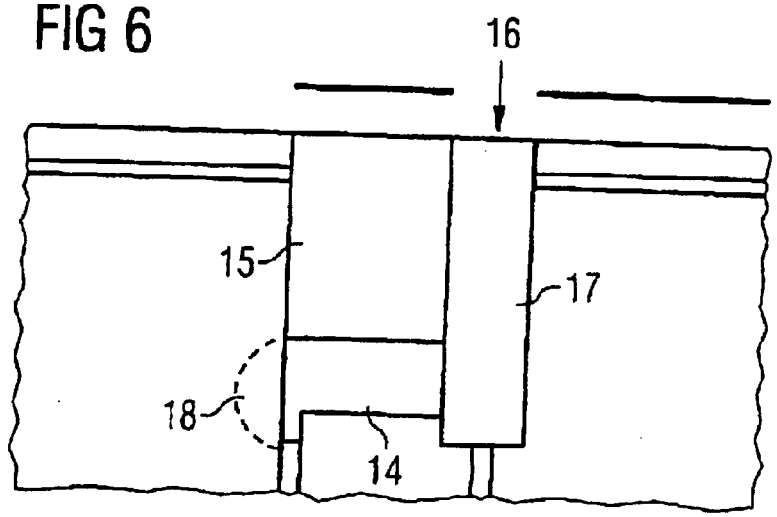

On the side opposite to the vertical selection transistor, by means of a corresponding photomask, an insulating trench 16 is etched and then filled with insulating material 17. In a thermal outdiffusion process, an n-doped buried strap region 18 is then produced by outdiffusion from the n-doped third polysilicon 14, which region subsequently serves as lower source/drain region of the vertical selection transistor. This method state is illustrated in FIG. 6. It will be understood, however, that the thermal outdiffusion process can also be performed at a later point in time.

Figure 7:
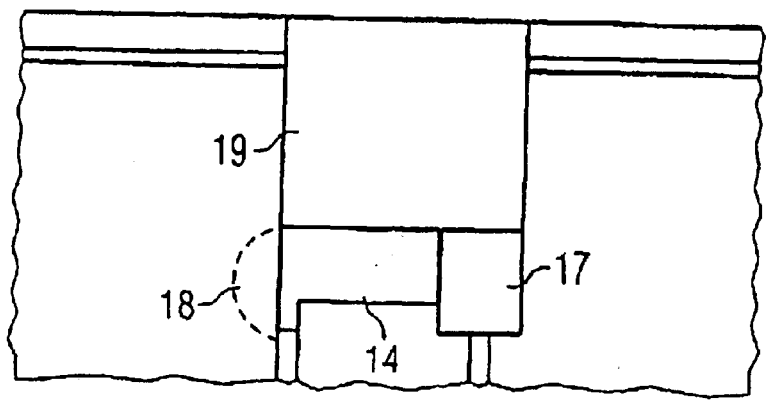

Both the filling material 15 above the third polysilicon 14 and the insulating material 17 in the insulating trench 16 are etched back down to the third depth, that is to say down to the upper edge of the third polysilicon 14, in a fourth recess step. The filling material 15 is completely removed in the process. The third polysilicon 14 may serve as an etching stop during this fourth recess step. Afterward, the etched-free upper region of the trench hole is filled with a protective material 19. This method state is illustrated in FIG. 7.

Next, recesses for accommodating the buried word lines are patterned. For this purpose, the silicon substrate is etched selectively at locations 21 and 22 with the aid of the photomask 20, the protective material 19 still remaining during this first etching step. A silicon needle 23 situated beside the trench hole is also left during this first etching step. The silicon needle 23 will subsequently serve as a channel region of the selection transistor, a conductive channel being able to form within the silicon needle 23 depending on the potential of the word line. The method state after the first etching step is illustrated in FIG. 8.

The protective material 19 is completely removed in a subsequent second etching step. The third polysilicon 14 serves as an etching stop during this second etching step. Recesses 24 for the word lines are completely etched away after the second etching step.

Afterward, a covering oxide layer 25 is introduced into the recesses 24, said layer having the task of insulating the trench filling from the word line situated above. In order to produce the covering oxide layer 25, the recesses 24 are first filled with an oxide or with another insulating material by means of a CVD method (chemical vapor deposition). This insulating material is subsequently etched back until only the covering oxide layer 25 having the desired thickness is present. A gate oxide 26 is applied to the sidewalls of the recesses 24 in a thermal process. The gate oxide is a thin oxide produced thermally. The corresponding method state is shown in FIG. 9.

Figure 10:
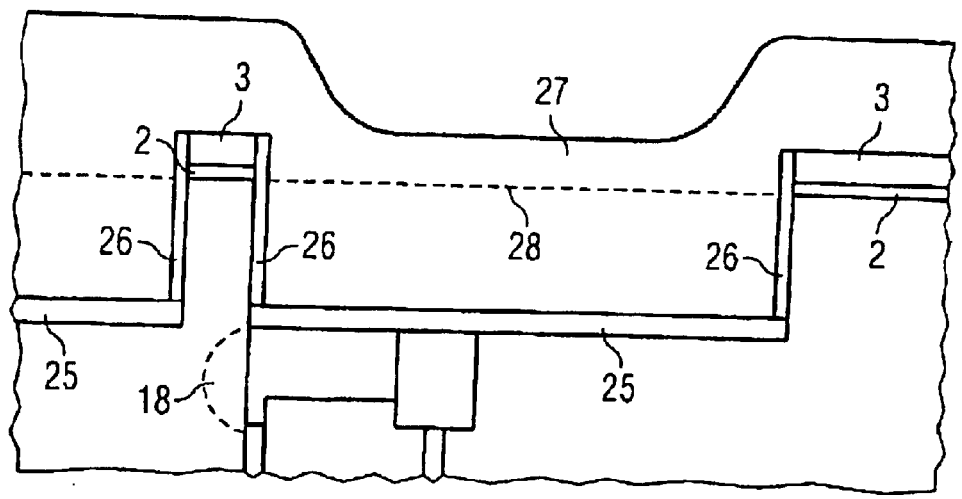
FIG. 10 is a similar view illustrating a tenth method state in accordance with a first method alternative.
Figure 11:
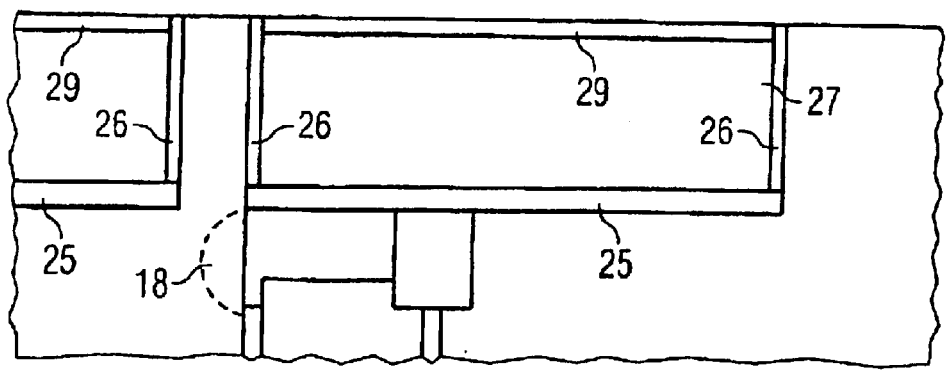
FIG. 11 shows an eleventh method state in accordance with the first method alternative.
Figure 12:
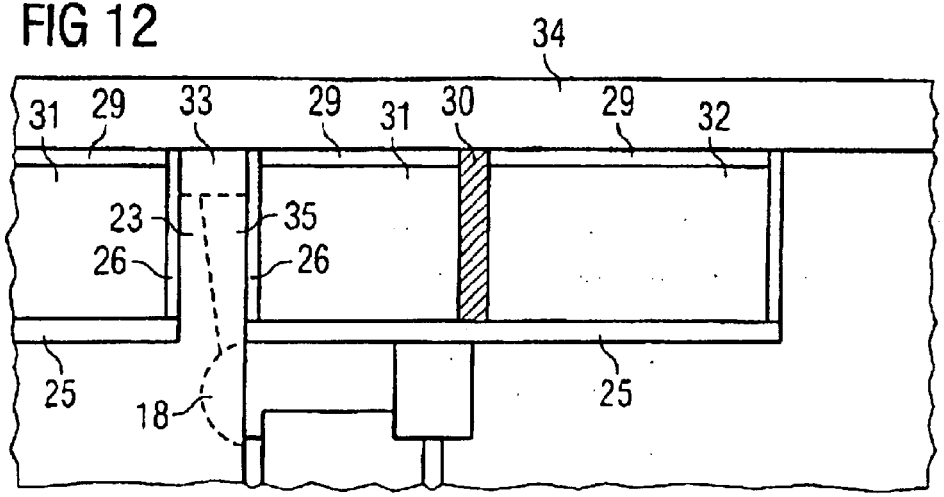
FIG. 12 shows a twelfth method state in accordance with the first method alternative.

Next, conductive material for the word lines must be introduced into the recesses 24. In this case, the silicon needles are enclosed by the conductive material. In the first method alternative for patterning the word lines, which is illustrated in FIGS. 10 to 12, firstly n-doped polysilicon 27 is deposited on the prepatterned substrate by means of a CVD method. This method state is illustrated in FIG. 10.

Afterward, the substrate is ground plane by means of a chemical mechanical polishing method (CMP), to be precise such that the initially applied nitride layer 3 and also the thermal oxide layer 2 are concomitantly removed. The level to which the substrate is ground away is depicted as line 28 in FIG. 10.

After the process of grinding plane, the polysilicon 27 is etched back to below the substrate surface. Insulating material is subsequently deposited on the etched-back polysilicon 27 by means of CVD, to be precise preferably oxide or nitride. After the deposition of the insulating material, the substrate surface is again ground plane by means of chemical mechanical polishing (CMP) in order thus to pattern an insulating layer 29. This method state is illustrated in FIG. 11.

Next, the individual word lines arranged next to one another must be electrically insulated from one another. For this purpose, with the aid of a mask step, isolation trenches for word line separation are etched out of the n-doped polysilicon 27. In this case, the covering oxide layer 25 preferably serves as an etching stop during the patterning of the isolation trenches. After etching, the isolation trenches are filled with insulating material, preferably with oxide or nitride. FIG. 12 shows how a first word line 31 is insulated from a second word line 32 by means of an isolation trench 30. In this case, the silicon needle 23 is enclosed all around by the first word line 31.

In order to be able to make better contact with the silicon needle 23 via the bit line situated above, an n-doped region 33 may be produced in an upper region of the silicon needle 23 by means of ion implantation.

As in previous methods, various metalization planes may then be applied to the substrate that has been prepatterned in this way. Bit lines which serve for the contact connection of the channel regions in the silicon needles are patterned directly on the substrate surface. In this case, a bit line 34 runs perpendicular to the word lines 31, 32. This method state is illustrated in FIG. 12.

The trench capacitor can be contact connected with the bit line 34 via a conductive channel 35 that can be formed within the silicon needle 23. In this case, the fact of whether a conductive channel 35 forms within the silicon needle 23 depends on the potential of the word line 31 which encloses the silicon needle 23 all around.

Polysilicon was used as conductive material in the method for patterning the word lines presented with reference to FIGS. 10 to 12. An alternative method for patterning the word lines is described with reference to FIGS. 13 and 14. There, instead of polysilicon, a layer structure comprising polysilicon, titanium and tungsten is introduced into the recesses 24. This makes it possible to increase the conductivity of the word lines compared with the polysilicon solution.

Figure 13:
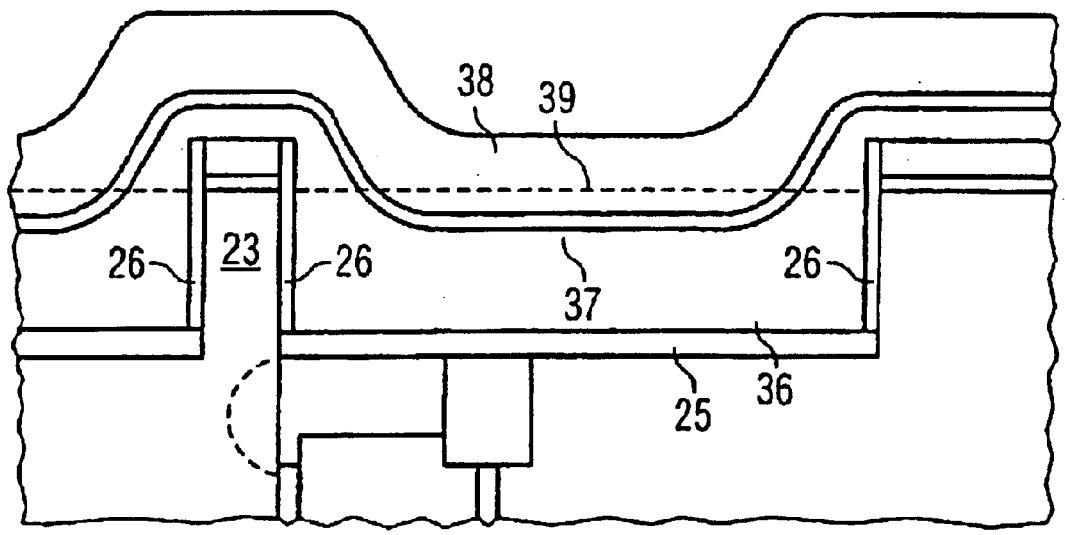
FIG. 13 shows a tenth method state in accordance with a second method alternative.

The method state shown in FIG. 9 is taken as a starting point for producing the layer structure. An n-doped polysilicon layer 36 is deposited onto the prepatterned substrate by means of a CVD method. However, the thickness of the polysilicon layer 36 is smaller than the thickness of the polysilicon layer 27 shown in FIG. 10. A thin titanium layer 37 is deposited onto the polysilicon layer 36. A tungsten layer 38 is subsequently applied to the titanium layer 37, which serves as "interface layer." The tungsten layer 38 is responsible for the low conduction resistance of the layer structure. The method state thus reached is illustrated in FIG. 13.

Next, the substrate surface is ground plane by means of chemical mechanical polishing (CMP). The nitride layer 3 applied at the beginning and the thermal oxide layer 2 are also removed during the grinding of the substrate. The level to which the substrate is ground away is depicted as broken line 39 in FIG. 13.

The insulation between the buried word lines and the bit lines situated above is then patterned. For this purpose, the layer structure introduced into the recesses 24 is firstly etched back slightly. Afterward, an insulating material such as oxide or nitride is deposited on the substrate surface by means of CVD, and then the substrate surface is once again ground plane by means of chemical mechanical polishing (CMP). An insulating layer 40 is produced in this way.

At the present method state, the recesses 24 are surrounded by a continuous conductive layer structure enclosing the silicon needles. This contiguous conductive structure in the recesses 24 must now be divided into individual, separately drivable word lines with the aid of isolation trenches. For this purpose, in a mask step, isolation trenches for word line separation are etched out of the prepatterned substrate. The covering oxide layer 25 preferably serves as an etching stop in this case. The isolation trenches thus obtained, for example an isolation trench 41, are subsequently filled with insulating material (e.g. oxide, nitride). Afterward, the substrate surface is once again planarized by means of CMP. The isolation trench 41 insulates a word line 42 from a word line 43. The silicon needles are in each case enclosed by an associated word line. By way of example, the silicon needle 23 is enclosed all around by the word line 42.

Figure 14:
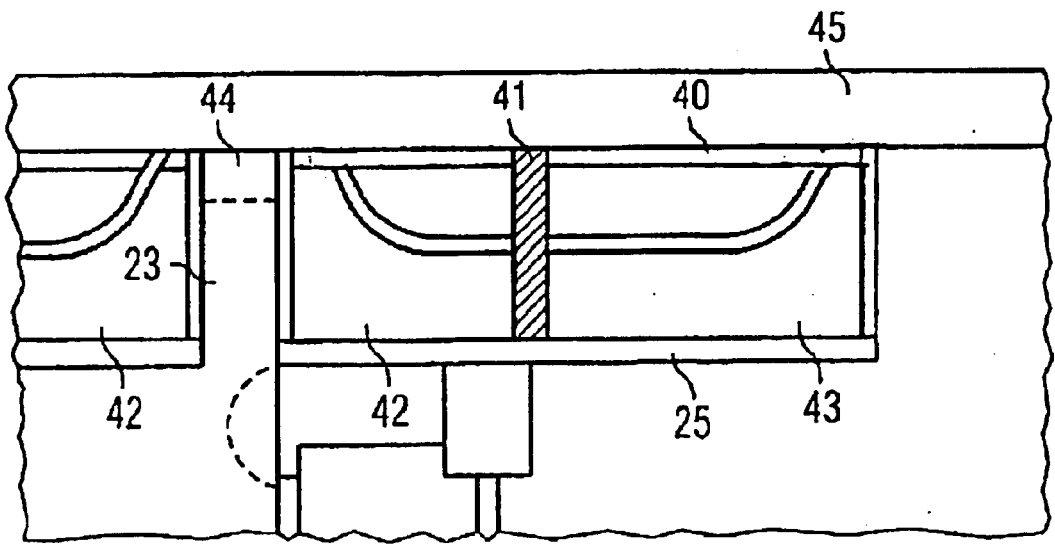
FIG. 14 shows an eleventh method state in accordance with the second method alternative.

Bit lines are subsequently applied to the silicon substrate that has been prepatterned in this way with the word lines introduced into the recesses 24. In order to be able to make better contact with the silicon needles by means of the bit lines, the silicon needles can be implanted with n-doping material in an upper region 44. In this case, as seen from above, the bit lines run perpendicular to the word lines. By way of example, a bit line 45, with which the silicon needle 23 is contact-connected, runs perpendicular to the word lines 42, 43. This method state is illustrated in FIG. 14.

Figure 15A:
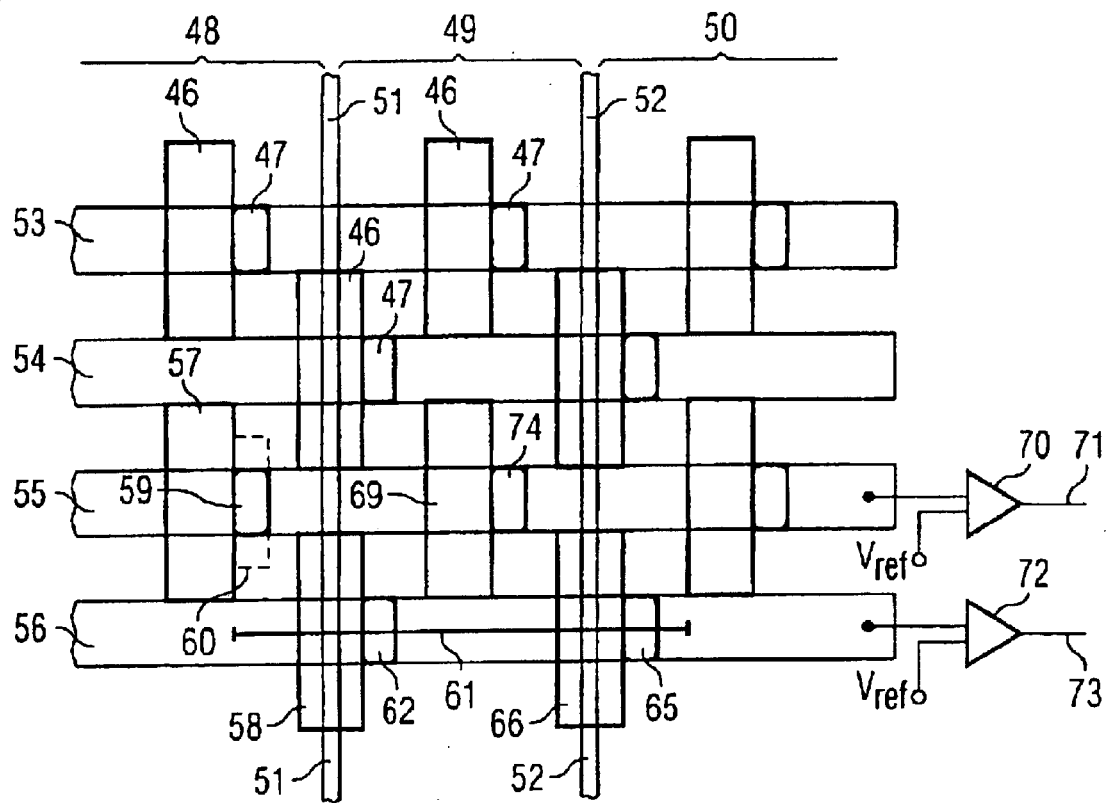
FIG. 15A is a plan view of a first layout variant of the invention, in which a folded bit line concept is utilized.

FIG. 15A illustrates a first layout variant of a memory cell array according to the invention in plan view. Trench holes 46 are discernible, which have a rectangular trench form with a relatively large ratio of width to length. In the solution shown in FIG. 15A, the trench holes 46 have an extent of 3 F in the word line direction, while the extent in the bit line direction is approximately 1 F. In this case, the quantity F denotes the minimum resolution width of the fabrication process used, that is to say of the lithography used. In the layout variant shown in FIG. 15A, a ratio of length to width of 3 to 1 results for the trench holes 46. This results in a relatively large periphery of the rectangular trench holes 46. Given the same area of a rectangle, the periphery is larger, the larger the difference between length and width. Since it is principally the periphery of the trench holes that contributes to the capacitance, the large ratio of length to width results in a relatively high trench capacitance with respect to the cell area.

Compared with a square trench hole, a larger etching depth can be realized with a rectangular trench hole. Even with further miniaturization of the dimensions of the memory cell, a sufficiently high storage capacitance of the trench holes can be ensured by the trench holes being etched to a corresponding depth.

The small extent of the trench holes 46 in the bit line direction makes it possible to choose the width of the word lines to be relatively small and to attain a compact construction of the memory cell array in this way. However, this presupposes that the conductivity of the buried word lines is sufficiently high even with a small word line width.

In the first layout variant shown in FIG. 15A, silicon needles 47 are respectively arranged in the center of a longitudinal side of the trench holes 46. In FIG. 15A, the silicon needles 47 are respectively arranged at the right-hand longitudinal side in the case of all the trench holes. The silicon needles 47 are led through word lines 48, 49, 50 to the substrate surface and to the bit lines, each silicon needle being surrounded all around by the associated word line. Arranged between a silicon needle 47 and the surrounding word line is a gate oxide layer which encloses the silicon needle and insulates it from the associated word line. A conductive channel forms within the silicon needles 47 depending on the potential of the surrounding word line. In this respect, the enclosing word line provides the gate potential for the channel region that can be formed within the silicon needles 47. In this respect, it is possible to talk of a vertical selection transistor with a peripherally arranged gate electrode or of a "surrounded gate transistor."

The buried word lines 48, 49, 50 are insulated from one another by isolation trenches 51, 52, 53 for word line separation. The isolation trench 51 runs between the word lines 48 and 49, while the isolation trench 52 insulates the word lines 49 and 50 from one another. With the aid of so-called spacer techniques, the isolation trenches for word line separation can be fabricated so narrow that their width is smaller than the minimum resolution width F of the fabrication process used. By virtue of this narrowing of the isolation trenches, the word lines are correspondingly widened without enlarging the space requirement of the memory cell overall. This leads to a reduction of the word line resistance and thus to a faster activation of the memory cells. In this respect, a low word line resistance results in a shorter access time to the selected memory cell with regard to write or read accesses.

The silicon needles 47 are contact-connected directly by bit lines 54, 55, 56, 57 at the substrate surface. The channel regions of the selection transistors are activated via the word lines 48, 49, 50, while information is read from the memory cell and information is written to the memory cell via one of the bit lines 54, 55, 56, 57. Since the silicon needles 47 are contact-connected by the respective associated bit line above the word-line upper edge, space for bit line contact connections does not have to be left free between the word lines. The bit line contact connection is effected directly via the channel regions of the vertical selection transistors. In this respect, the entire area available in the word line plane can be utilized for the word lines 48, 49, 50, which therefore have a high cross-sectional area and a low bulk resistance. The conflicting requirements for wide word lines, on the one hand, and for a small space requirement of the cells, on the other hand, can be reconciled with one another in a convincing manner with the aid of "surrounded gate transistors" activated by buried word lines.

The bit line contact connections which have been required hitherto in the solutions of the prior art and have run through the word lines can be obviated in the memory cell arrays according to the invention. In the solutions of the prior art, it was often not possible to fabricate the contact to the bit line satisfactorily, or an undesirable contact between the bit line contact connection and an adjacent word line arose. Therefore, the bit line contact connections were held to be a "yield detractor" of the respective fabrication process, that is to say critical with regard to the yield. Since bit line contact connections running through the word line plane are no longer required in the solution according to the invention, these problems in the fabrication process are eliminated.

In the first layout variant shown in FIG. 15A, the trench holes are in each case arranged offset relative to one another as seen in the bit line direction. This results in a regular arrangement of the trench holes 46. The distance between a trench hole and the surrounding trench holes is maximal with an arrangement of this type. Small inaccuracies in the mask alignment and slight process tolerances have only little significance in the case of such an arrangement of the trench cells. Since the distance between a trench hole and all the adjacent cells is essentially of the same magnitude, it is possible to increase the trench capacitance by "bottling," that is to say by wet-chemical afteretching. As a result, a sufficiently large trench capacitance, ensuring reliable data storage, can be made available even with small cell dimensions.

In the first layout variant shown in FIG. 15A, the silicon needles 47 and also the buried strap regions situated below the silicon needles are in each case arranged at the right-hand longitudinal side in the case of all the trench holes. This arrangement results in a relatively large distance between the buried strap region of a trench hole 57 and an adjacent buried strap region of a trench hole 58. A crosstalk between the buried strap region of the trench hole 57 and the buried strap region of the trench hole 58 does not take place because the two buried strap regions face away from one another. Parasitic currents and leakage currents are effectively prevented on account of the large distance between adjacent buried strap regions.

The silicon needles of the cell array shown in FIG. 15A have an extent of 0.5 F in the bit line direction, while the extent in the word line direction is 1 F. A cross-sectional area of approximately 0.5 $F^2$ therefore results for the silicon needles. The silicon needles are contact-connected by the bit lines running above, whose width amounts to 1 F and, in this respect, corresponds to the extent of the silicon needles in the word line direction. By way of example, a silicon needle 59 is contact-connected by the bit line 55. One important aspect in the case of a memory cell layout is what accuracy requirements have to be taken into consideration with regard to the positioning and alignment of the photomasks. The acceptable inaccuracy in the mask alignment can be increased by enlarging the silicon needles in the word line direction. Such an enlarged silicon needle 60 is concomitantly illustrated in FIG. 15A. The smaller the structural dimensions become, the more important it becomes to ensure a robust layout which is relatively insensitive to process and manufacturing tolerances.

Figure 15B:
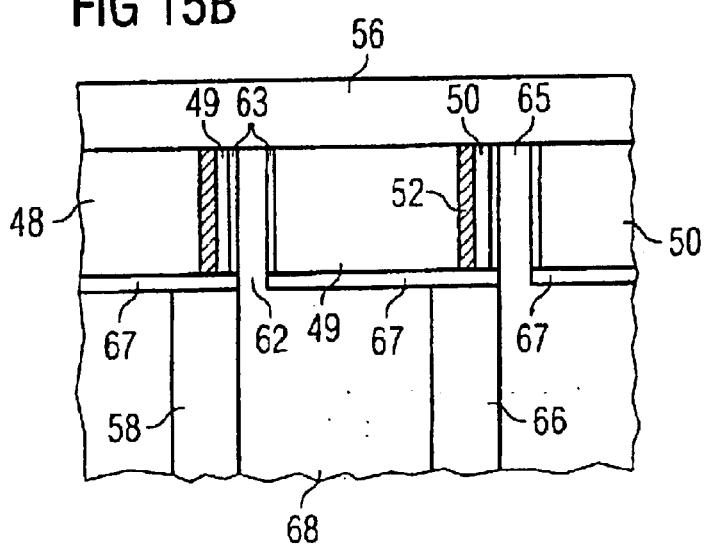
FIG. 15B is a section taken along the line 61 in FIG. 15A.

FIG. 15B shows a section through the memory cell array illustrated in FIG. 15A along a line 61. In this case, the line 61 runs in the bit line direction along the bit line 56. The sectional drawing reveals the buried word line 48, which is isolated from the word line 49 by the isolation trench 51 for word line separation. A silicon needle 62 extends through the word line 49 as far as the bit line 56. The silicon needle 62 is insulated from the surrounding word line 49 by means of a gate oxide layer 63. A conductive channel forms within the silicon needle 62 depending on the potential of the word line 49, said channel producing a connection between a buried strap region 64 arranged at the trench hole 58 and the bit line 56. The word line 50 is isolated from the word line 49 by the isolation trench 52. The word line 50 encloses a silicon needle 65, via which a trench hole 66 can be connected to the bit line 56. The word lines 48, 49, 50 are insulated from the trench holes 58, 66 and also from a substrate 68 by a covering oxide layer 67.

In the first layout variant shown in FIGS. 15A, 15B, the readout of the bit lines 53, 54, 55, 56 is effected in accordance with the concept of the unfolded bit line ("open bit line concept"). In accordance with this concept, before the actual read-out operation, a reference potential $V_{ref}$ is momentarily switched onto the bit line to be read, for example to the bit line 55 shown in FIG. 15A. As a result, the bit line 55 is brought to a defined potential. The word line 49 associated with a memory cell 69 to be read is not yet activated at this point in time. The bit line 55 is subsequently isolated from $V_{ref}$ again, and the memory cell 69 is read through activation of the associated word line 49. The charge of the memory cell 69 flows onto the bit line 55, which is connected to a first input of a differential amplifier 70. The reference potential $V_{ref}$ is present at the second input of the differential amplifier 70. The differential amplifier 70 amplifies the potential difference between the potential of the bit line 55 and the reference potential $V_{ref}$ and thus generates a read-out signal 71.

In contrast with the process in the folded bit line concept, in the unfolded bit line concept ("open bit line concept"), each bit line is read separately, the reference potential $V_{ref}$ having to be provided in each case as an external potential. In order to read the bit line 56 adjacent to the bit line 55, a dedicated differential amplifier 72 is therefore provided, which amplifies the difference between the potential of the bit line 56 and the reference potential $V_{ref}$ and thus generates a read-out signal 73.

The use of the "open bit line concept" affords the advantage that silicon needles 74 and 62, which are contact-connected by the adjacent bit lines 55 and 56, can be activated by the same word line 49 without this leading to any disturbances. As a result, when using unfolded bit lines, the word lines can be made approximately twice as wide as would be possible when using folded bit lines. The resistance of the word lines can therefore be significantly reduced by the use of the "open bit line concept."

FIG. 15C once again illustrates the first layout variant shown in FIG. 15A, the read-out of the bit lines here being performed in accordance with the "folded bit line concept." In accordance with the folded bit line concept, the read-out signal is formed as the difference between the potentials of adjacent bit lines. If the intention is to read a trench hole 75, which is connected to a bit line 77 via a silicon needle 76, then the potential difference between the potential of the bit line 77 and the potential of an adjacent bit line 79 is determined and amplified in a differential amplifier 78 in order thus to obtain a read-out signal 80. With this procedure, it is not necessary for an external reference potential $V_{ref}$ to be available, because here the potential of the adjacent bit line 79 serves as reference potential. However, when using folded bit lines, it is indispensable that the trench holes 75, 81 associated with adjacent bit lines 77, 79 are addressed by separate word lines 82, 83. The word line 49 illustrated in FIG. 15A, having a width of approximately 3 F, must therefore be separated by means of an additional isolation trench 84 into two narrower word lines 82, 83, whose width is now just under 2 F. For the read-out of the trench hole 75, only the word line 82 is activated, which brings about an active channel within the silicon needle 76. The word line 83 is not activated, and, in this respect, no conductive channel forms within the silicon needle 85 associated with the trench hole 81. It is only for this reason that the potential of the bit line 79 can be used as a reference potential for the differential amplifier 78.

One advantage when using the folded bit line concept is that an external reference potential does not have to be made available to the memory cell array. A further advantage is that the time required for the read-out operation is shorter in the case of the solution shown in FIG. 15C ("folded bit line concept") than in the case of the solution shown in FIG. 15A, because the bit lines have to be initialized with $V_{ref}$ before the actual read-out in the case of the solution shown in FIG. 15A. This step of initialization with $V_{ref}$ is obviated in the case of the solution shown in FIG. 15C, so that the desired memory cell can be accessed more rapidly here.

Additional isolation trenches 84, 86, 87 for word line separation have to be patterned in order to realize the folded bit line concept. However, the size of a memory cell is not altered as a result of this in comparison with FIG. 15A: the size of the memory cell amounts to 2 F×4 F=8 $F^2$ both in the case of the solution shown in FIG. 15A and in the case of the solution shown in FIG. 15C. The first layout variant illustrated in FIGS. 15A, 15B and 15C is therefore suitable both for folded and for open bit lines.

Figure 16A:
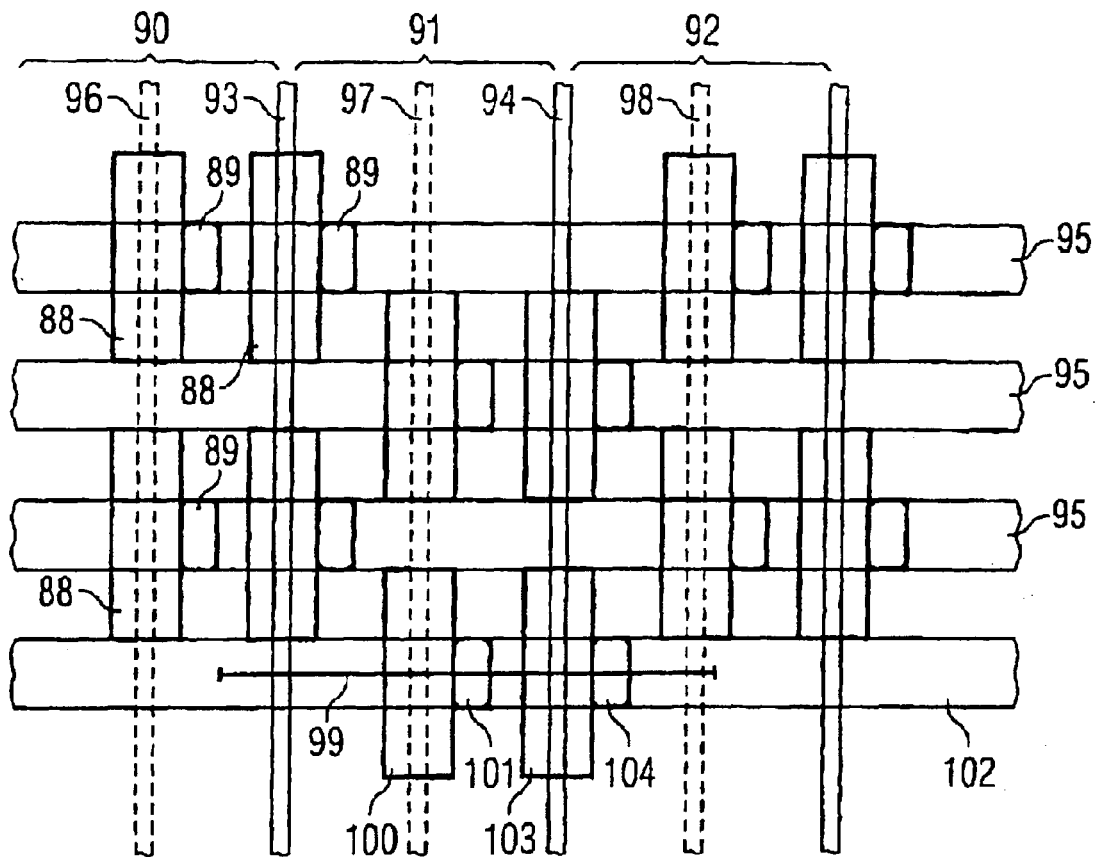
FIG. 16A is a plan view of a second layout variant of the invention.
Figure 16B:
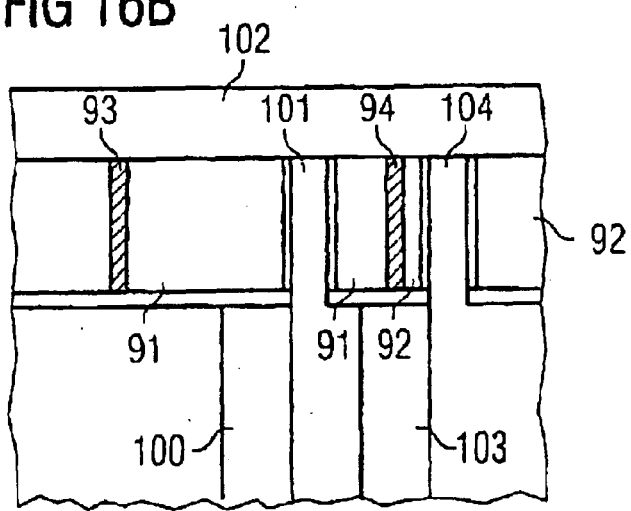
FIG. 16B is a section taken along the line 99 in FIG. 16A.

FIGS. 16A and 16B illustrate a second layout variant. In contrast to the first layout variant, here trench holes 88 are in each case arranged offset relative to one another in a pairwise manner as seen in the bit line direction. Silicon needles 89 serve as channel regions of the selection transistors and are respectively arranged at the right-hand longitudinal side of the trench holes 88. Word lines 90, 91, 92 enclosing the silicon needles are provided for the driving of the selection transistors. The word lines 90, 91, 92 are insulated from one another by isolation trenches 93, 94. Via bit lines 95, information can be written to the trench capacitors and read from the trench capacitors.

Relatively wide word lines 90, 91, 92 are used in the second layout variant illustrated in FIG. 16A, and, in this respect, the bit lines must be read in accordance with the unfolded bit line concept ("open bit line concept"). However, the second layout variant illustrated in FIG. 16A can also be realized in accordance with the folded bit line concept. For this purpose, the word lines 90, 91, 92 are subdivided with the aid of additional isolation trenches 96, 97, 98 into narrower word lines, by means of which the individual silicon needles can be activated separately. The area requirement of the memory cell amounts to 2×4 F=8 $F^2$ both with the use of folded bit lines and with the use of unfolded bit lines.

FIG. 16B shows a sectional illustration along a line 99. A trench hole 100 can be written to and read from via a silicon needle 101 and a bit line 102. For this purpose, a conductive channel can be formed within the silicon needle 101 depending on the potential of the enclosing word line 91. Correspondingly, a trench hole 103 can be written to and read from via a silicon needle 104, the gate potential in this case being made available by the word line 92.

The second layout variant also makes use of trench holes with a rectangular cross section whose extent in the word line direction is greater than the extent in the bit line direction. The advantages of trench holes dimensioned in this way (relatively high trench capacitance, large etching depth, capability of realizing word lines with a small width) have already been discussed in connection with the first layout variant. In contrast to the first layout variant, the trench holes in the case of the second layout variant are arranged offset relative to one another in a pairwise manner in the bit line direction. In the majority of the memory cell configurations of the prior art, the trench holes have been arranged offset relative to one another in a pairwise manner. In this respect, this arrangement is advantageous with regard to the existing process experience.

The silicon needles are arranged at the same longitudinal side in the case of all the trench holes. This effectively prevents parasitic currents between adjacent channel regions. A further advantage of the second layout variant is that it can be used both with folded and with unfolded bit lines, the basic area always amounting to 8 $F^2$. In order to enlarge the tolerance range with regard to mask alignment, it is possible to enlarge the extent of the silicon needles 89 in the word line direction. As a result, the silicon needles 89 can be contact-connected more easily by the bit lines 95.

A third layout variant will be described below with reference to FIGS. 17A, 17B, 17C and 17D. As can be discerned from FIG. 17A, the trench holes are likewise arranged offset relative to one another in a pairwise manner in the case of this layout variant. In contrast to the layout variants described above, the silicon needles in this layout variant are arranged alternately at the right-hand longitudinal side and at the left-hand longitudinal side of the trench holes.

Silicon needles 105 are respectively arranged at the right-hand longitudinal side of trench holes 106, while silicon needles 107 are arranged at the left-hand longitudinal side of trench holes 108. The silicon needles are activated by means of word lines 110, 111, 112. Information is read out and written in via bit lines 109 running perpendicularly to the word lines 110, 111, 112. In the variant shown in FIG. 17A, the read-out of the bit lines 109 is effected in accordance with the unfolded bit line concept. Therefore, the word lines 110, 111, 112 can be made so wide that both the silicon needles 105 and the silicon needles 107 are controlled by the word line 111. In this case, the word lines 110, 111, 112 are isolated from one another by isolation trenches 113, 114.

Figure 17A:
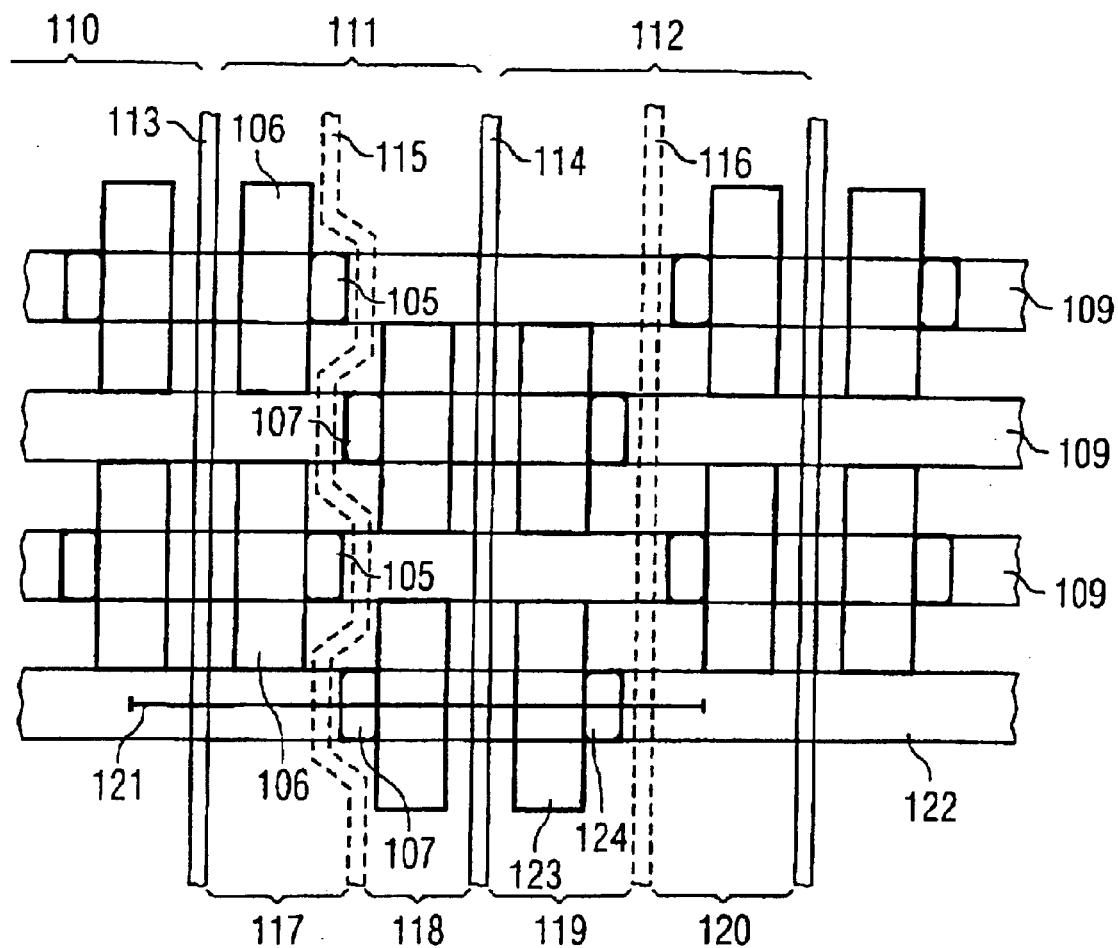
FIG. 17A is a plan view of a third layout variant of the memory cells according to the invention.

The third layout variant shown in FIG. 17A can also be used in accordance with the "folded bit line concept". This requires the wide word lines 110, 111, 112 to be split into narrower word lines 117, 118, 119, 120 with the aid of additional isolation trenches 115, 116. The word line 117 now only controls the silicon needles 105, while the silicon needles 107 are controlled by the word line 118. Silicon needles in mutually adjacent bit lines can be driven separately with the aid of the word lines 117, 118, 119, 120.

If the original memory cell size of 8 $F^2$ is to be maintained, then the isolation trench 115 has to be led through the silicon needles 115, 117 in zigzag fashion. This is shown in the left-hand half of FIG. 17A. As an alternative to this, the memory cell size of 2 F×4 F=8 $F^2$ can be enlarged to 2.25 F×4 F=9 $F^2$ by increasing the distance between adjacent trench hole rows. If such an enlargement of the memory cell size is accepted, then the isolation trench can be embodied as a rectilinear isolation trench 116. This is illustrated in the right-hand half of FIG. 17A.

Figure 17B:
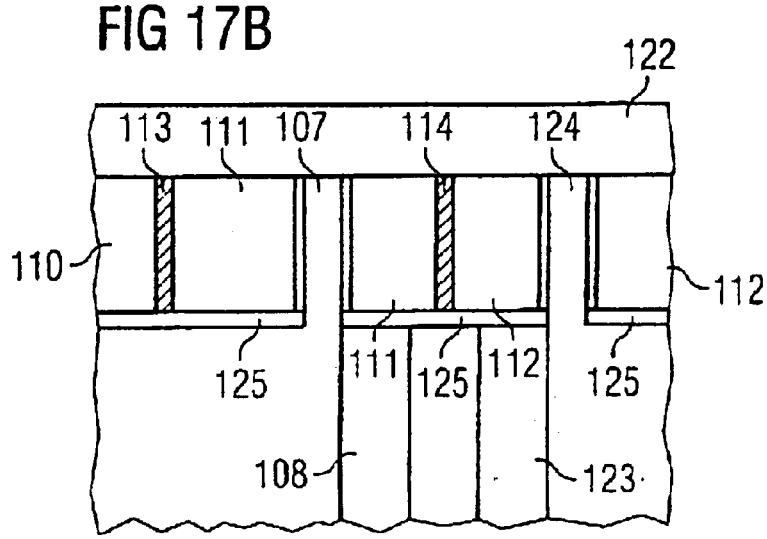
FIG. 17B is a section taken along the line 121 in FIG. 17A.

FIG. 17B shows a section through the memory cell array along a line 121, to be precise for the case of the "open bit line concept". The sectional illustration reveals the buried word lines 110, 111, 112, which are isolated from one another by the isolation trenches 113, 114 (shown hatched). A connection between the trench hole 118 and a bit line 122 can be produced via the silicon needle 107 depending on the potential of the word line 111. Correspondingly, a connection between a trench hole 123 and the bit line 122 can be produced via a silicon needle 124, controlled by the word line 112. A covering oxide layer 125 isolates the buried word lines 110, 111, 112 from the trench holes 108, 123.

The advantages of the third layout variant will be discussed briefly below. The advantages when using rectangular trench holes have already been discussed in connection with the first layout variant. The use of trench holes which are offset relative to one another in a pairwise manner in the bit line direction has the benefit of the process experience available with regard to this trench cell configuration. A further advantage of the third layout variant is that the silicon needles are all arranged in the center of the word lines 110, 111, 112 when using unfolded bit lines. The edge regions of the word lines remain free, and this results in a high conductivity of the word lines. The third layout variant can be used both with folded and with unfolded bit lines, but a certain enlargement of the basic area may have to be accepted.

It initially appears to be a disadvantage of the third layout variant that a direct spatial proximity between the buried strap regions of the trench holes 106 and the buried strap regions of the trench holes 118 arises on account of the alternating arrangement of the silicon needles. In order to prevent parasitic currents between the buried strap regions of the different trench holes, insulating trenches can be arranged below the covering oxide layer 125. The fabrication of these insulating trenches has already been explained in connection with FIGS. 6 and 7. FIG. 6 depicts the insulating trench 16, which is filled with insulating material 17 and shields the buried strap region 18 toward the rear.

Figure 17D:
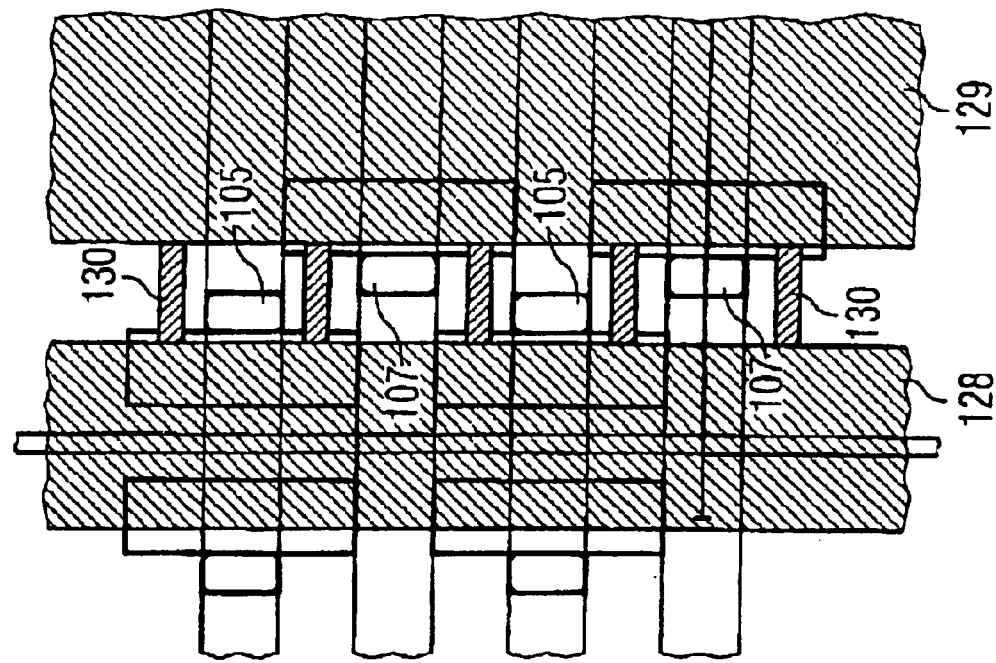
FIG. 17C and FIG. 17D are plan views showing the structure of the isolation trenches for the third layout variant of FIGS. 17A and 17B.
Figure 17C:
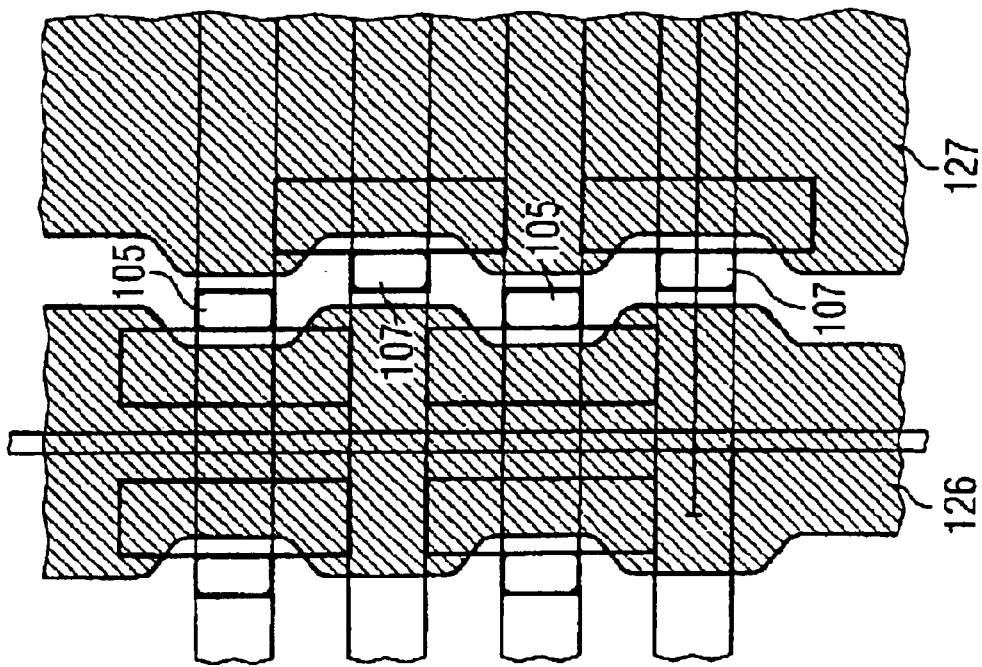

FIG. 17C shows how the occurrence of leakage currents can be restricted with the aid of insulating trenches 126, 127 arranged below the covering oxide layer 125. The insulating trenches 126, 127 may be patterned in one etching step in this case. FIG. 17D shows an alternative insulating trench structure, whose fabrication requires two etching steps. Insulating trenches 128, 129 and also insulating webs 130 are provided in the case of the structure illustrated in FIG. 17D. The insulating trench structure illustrated in FIG. 17D prevents any crosstalk between the silicon needles 105, 107.

Figure 18A:
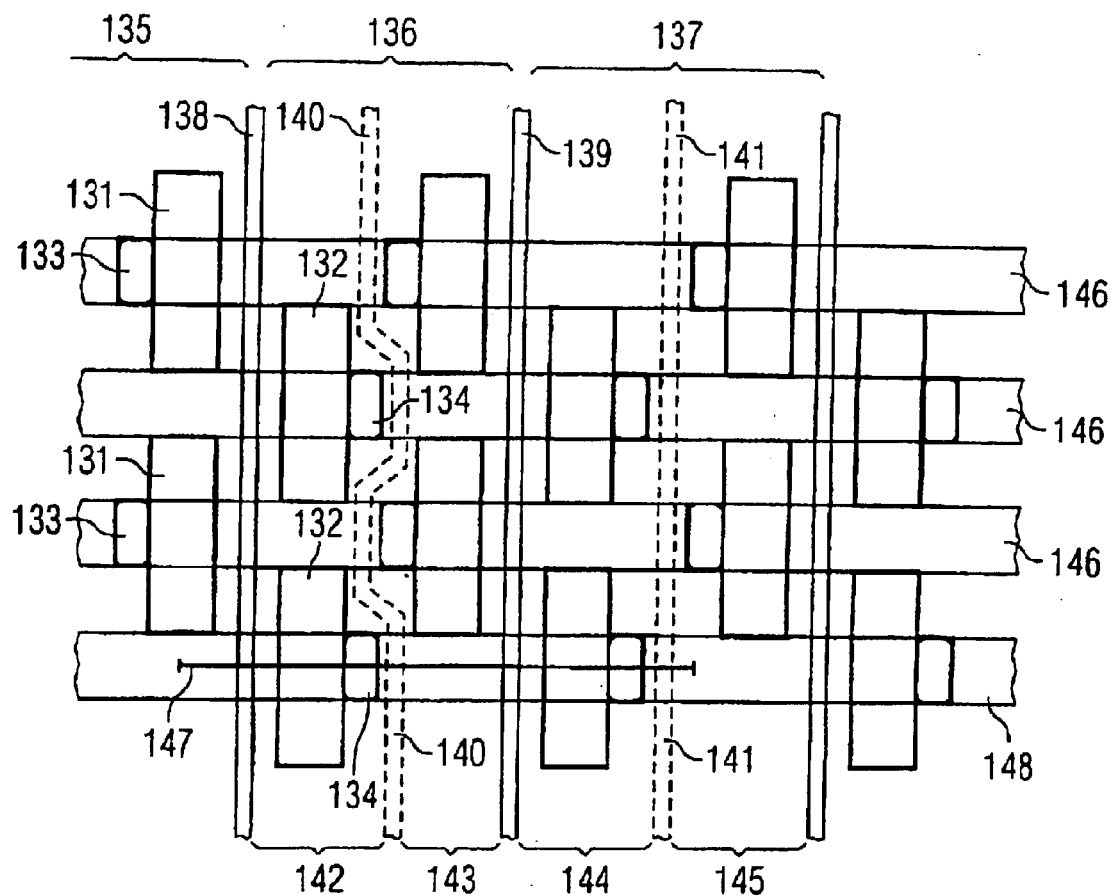
FIG. 18A is a plan view of a fourth layout variant of the solution according to the invention.
Figure 18B:
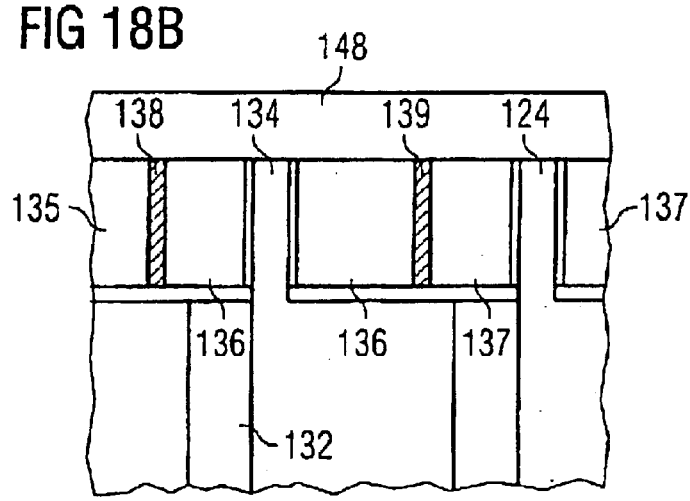
FIG. 18B is a section taken along the line 147 in FIG. 18A.

FIGS. 18A and 18B show a fourth layout variant, in which trench holes 131, 132 are arranged offset relative to one another as seen in the bit line direction. The channel regions are arranged alternately at the right-hand and left-hand longitudinal sides of the trench holes. Silicon needles 133 are respectively arranged at the left-hand longitudinal side of the trench holes 131, while silicon needles 134 are respectively arranged at the right-hand longitudinal side of the trench holes 132. Unfolded bit lines are used in the layout shown in FIG. 18A, and, in this respect, it is possible to use relatively wide word lines 135, 136, 137 insulated from one another by isolation trenches 138, 139. In the fourth layout variant, however, it is also possible to use folded bit lines. In this case, it is necessary to provide additional isolation trenches 140, 141, thereby producing narrowed word lines 142, 143, 144, 145. If the original cell size of 8 $F^2$ is to be maintained, a zigzag isolation trench 140 must be used. By contrast, in the case where the cell size is increased to 9 $F^2$, it is also possible to use a straight isolation trench 141. The trench cells are written to and read from via bit lines 146.

FIG. 18B illustrates a section along the line 147 through the memory cells arranged in accordance with the fourth layout variant. The trench hole can be written to and read from via the silicon needle 134 and a bit line 148. The activation of the conductive channel in the silicon needle 134 is effected via the word line 136, which is isolated from the adjacent word lines 135, 137 by the isolation trenches 138, 139.

The advantages when using rectangular trench holes have already been commented on in the context of the first layout variant. The regular arrangement of the trench cells enables a noncritical process implementation. All the silicon needles are arranged in the center of the word line, and this has a favorable effect on the conductivity of the word lines. The fourth layout variant allows the use of both folded and unfolded bit lines. Below the buried word lines, it is possible to form an isolation trench structure as shown in FIGS. 17C, 17D, by means of which parasitic currents can be prevented.

Figure 19A:
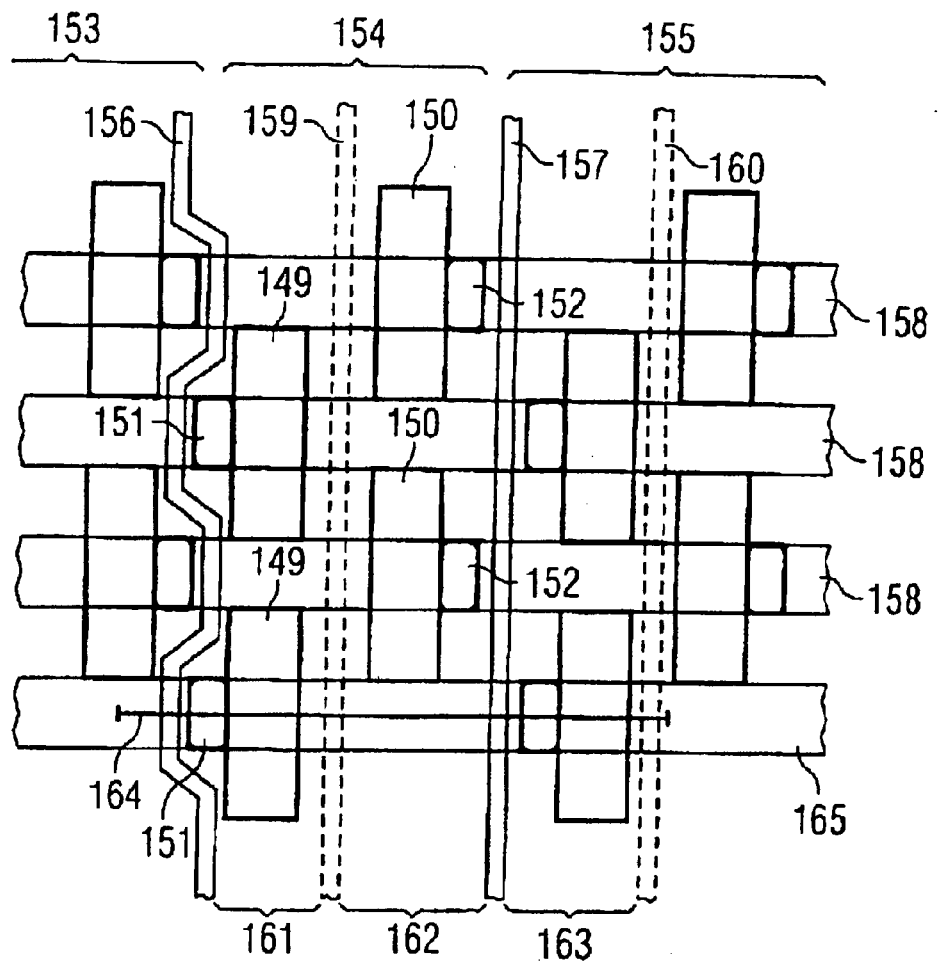
FIG. 19A is a plan view of a fifth layout variant of the invention.
Figure 19B:
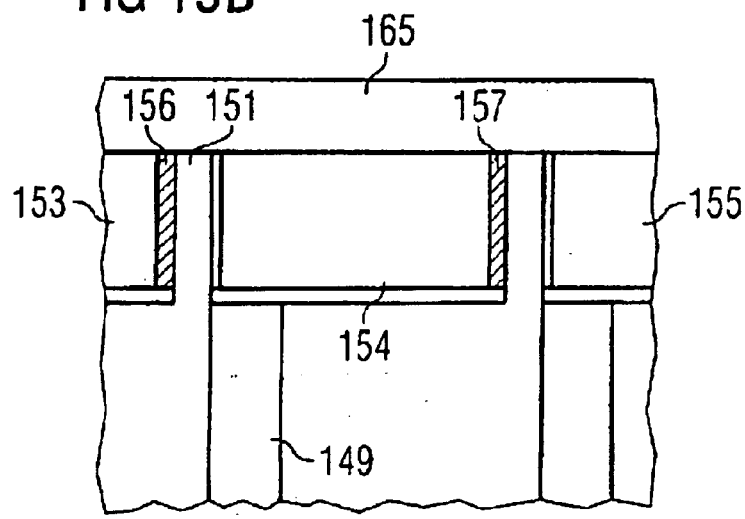
FIG. 19B is a section taken along the line 164 in FIG. 19A.

FIGS. 19A and 19B show a fifth layout variant. This layout variant corresponds to the layout variant shown in FIG. 18A, but the isolation trenches for word line separation are arranged differently. Trench holes 149, 150 are arranged offset relative to one another as seen in the bit line direction. The channel regions are arranged alternately at the right-hand and left-hand longitudinal sides of the trench holes. Silicon needles 151 are respectively arranged at the left-hand longitudinal side of the trench holes 149, while silicon needles 152 are respectively arranged at the right-hand longitudinal side of the trench holes 150. Unfolded bit lines are used in the case of the layout shown in FIG. 19A. The word lines 153, 154, 155 are therefore made relatively wide and are insulated from one another by isolation trenches 156, 157. If a cell size of 8 $F^2$ is to be realized, a zigzag isolation trench 156 has to be used. If 9 $F^2$ is acceptable, it is possible to use straight isolation trenches such as the isolation trench 157. In contrast to the variants discussed above, the silicon needles 151, 152 are arranged in a manner directly adjoining the isolation trenches 156, 157. Thus, the silicon needles 151, 152 are now only partially enclosed by the word lines 153, 154. The trench cells are written to and read from via bit lines 158.

Folded bit lines can also be used in the fifth layout variant. In this case, it is necessary to provide additional isolation trenches 159, 160, thereby producing narrowed word lines 161, 162, 163.

FIG. 19B illustrates a section along the line 164 through the memory cells arranged in accordance with the fifth layout variant. The trench hole can be written to and read from via the silicon needle 151 and a bit line 165. The activation of the conductive channel in the silicon needle 151 is effected via the word line 154, which is isolated from the adjacent word lines 153, 155 by the isolation trenches 156, 157.

The advantages when using rectangular trench holes have already been commented on in the context of the first layout variant. The regular arrangement of the trench cells enables a noncritical process implementation. All the silicon needles are arranged at the side regions of the word line, so that the central region of the word lines remains free, and this has a favorable effect on the conductivity of the word lines. By virtue of the fact that the silicon needles are arranged in a manner adjoining the isolation trenches, the silicon needles are surrounded by polysilicon on one side and by insulator on the other side. The properties of the vertical selection transistor therefore deviate from the variants discussed above, which can result in advantages. The fifth layout variant allows the use of both folded and unfolded bit lines. Below the buried word lines, it is possible to form an isolation trench structure as shown in FIGS. 17C, 17D, by means of which parasitic currents can be prevented.

Figure 20A:
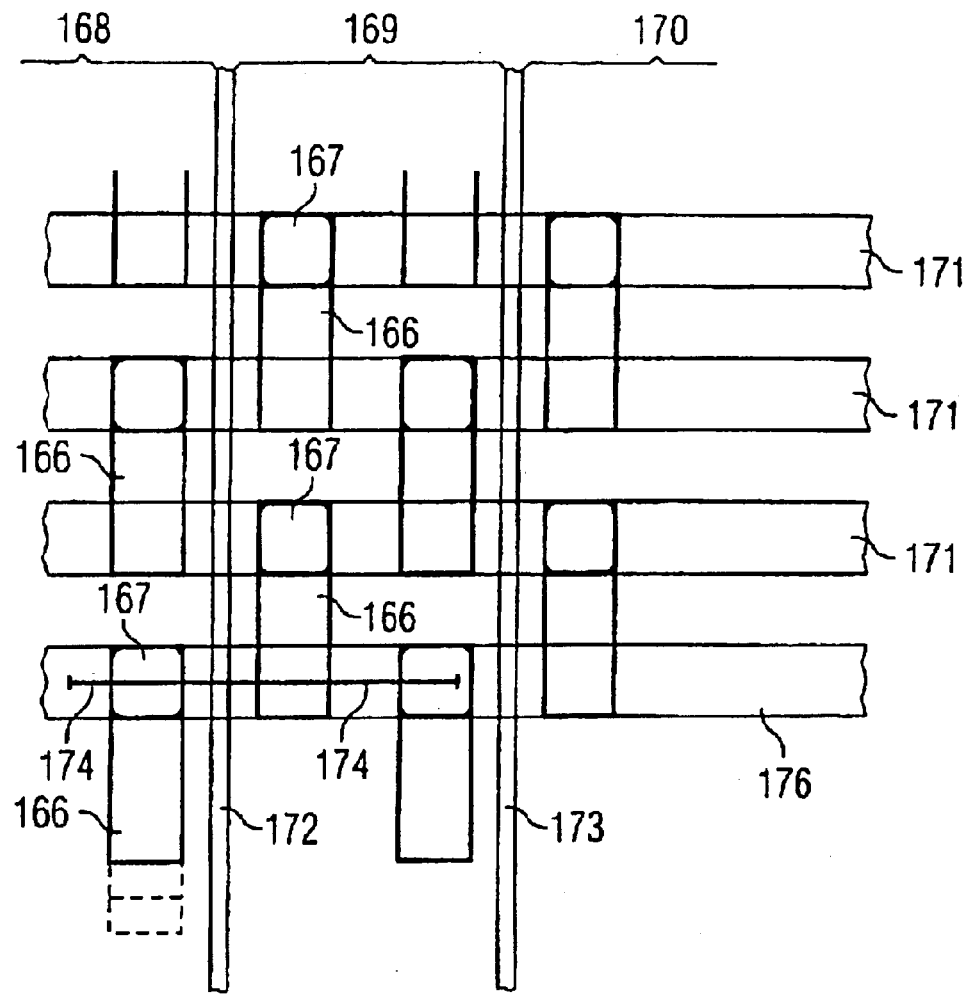
FIG. 20A is a plan view of a sixth layout variant of the invention, in which the channel regions are respectively arranged at the end sides of the trench holes.
Figure 20B:
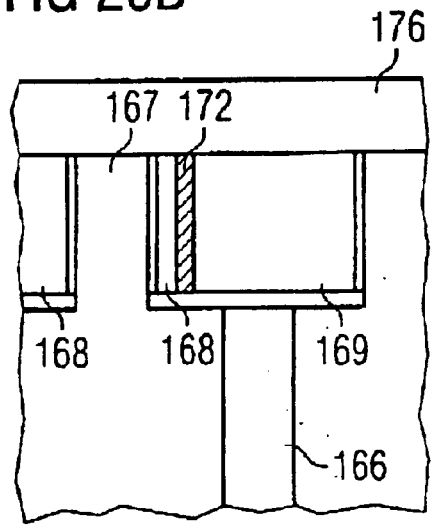
FIG. 20B is a section taken along the line 174 in FIG. 20A.

FIGS. 20A and 20B illustrate a sixth layout variant, in which, unlike in the variants shown previously, the channel regions are not arranged at the longitudinal sides of the trench holes, but rather at the end sides of the trench holes. Trench holes 166 are arranged offset relative to one another in the bit line direction. Silicon needles 167 having a cross-sectional area of approximately 1 $F^2$ are respectively arranged at the upper end side of the trench holes. The extent of the trench holes in the word line direction amounts to 2 F, but can also be increased to approximately 2.5 F. The silicon needles 167 are activated by word lines 168, 169, 170. Since the use of unfolded bit lines 171 is recommended in the case of the sixth layout variant owing to the width of the silicon needles 167, the word lines can be made relatively wide. The word lines are insulated from one another by isolation trenches 172, 173 running in the word line direction.

FIG. 20B illustrates a sectional illustration along a line 174. The illustration shows the silicon needle 167, via which it is possible to produce a connection between a trench hole 175 situated further in front (and therefore not discernable in the sectional illustration) and a bit line 176. The silicon needle 167 is surrounded by the word line 168. The trench hole 166 is illustrated below the word line 169, the associated silicon needle not being discernable here.

Figure 21A:
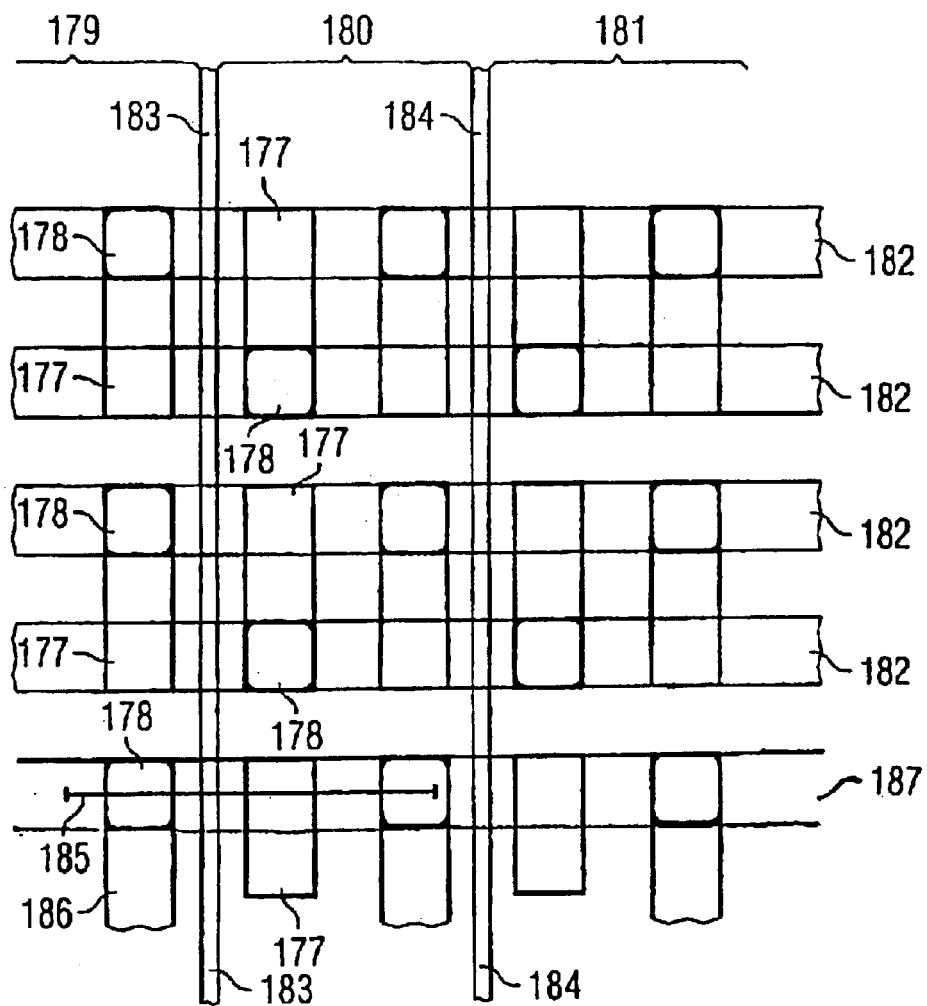
FIG. 21A is a plan view of a seventh layout variant of the invention.
Figure 21B:
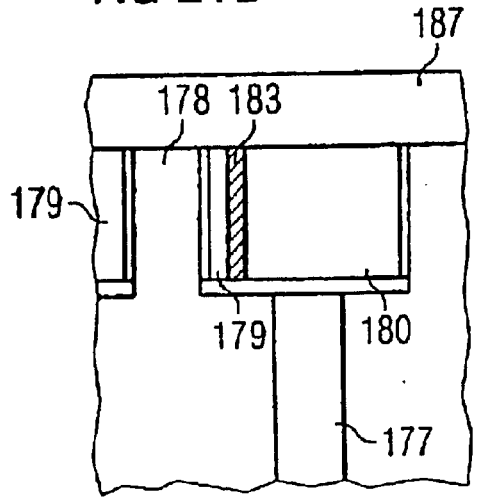
FIG. 21B is a section taken along the line 185 in FIG. 21A.

FIGS. 21A and 21B illustrate a seventh layout variant, in which the channel regions are likewise arranged at the end sides of the trench holes. In contrast to the sixth layout variant shown in FIGS. 20A and 20B, here the silicon needles are arranged alternately at the upper and at the lower end side of the trench holes. Trench holes 177 are arranged offset relative to one another in the bit line direction. Silicon needles 178 are arranged, as seen in the bit line direction, alternately at the upper and the lower end sides of the trench holes 177. The silicon needles 178 are activated by word lines 179, 108, 181. Since the use of unfolded bit lines 182 is recommended in the case of the seventh layout variant owing to the width of the silicon needles 178, the word lines can be made relatively wide. The word lines are insulated from one another by isolation trenches 183, 184 running in the word line direction.

FIG. 21B illustrates a sectional illustration along a line 185. The illustration shows the silicon needle 178, via which it is possible to produce a connection between a trench hole 186 situated further in front (and therefore not discernable in the sectional illustration) and a bit line 187. The silicon needle 178 is surrounded by the word line 179. The trench hole 177 is illustrated below the word line 180, the associated silicon needle not being discernable here.

The sixth and seventh layout variants likewise use rectangular trench holes whose extent in the word line direction amounts to between 2F and 3F, and the advantages of which have already been discussed in connection with the first layout variant. In the sixth layout variant, the arrangement of the trench holes is highly regular, resulting in a maximum distance between the trench holes. This means that possible inaccuracies during the process implementation are less significant. Both in the case of the sixth layout variant and in the case of the seventh layout variant, the silicon needles are arranged at the end sides of the trench holes. As a result, a bulging of the trench holes is avoided, and a compact arrangement is produced which can still be controlled in terms of process engineering even in the event of further miniaturization of the structural dimensions. On account of the relatively large cross section of approximately 1 $F^2$, the channel regions have a high current yield and allow the trench capacitances to be written to and read from rapidly. The structures shown are suitable in particular for use with unfolded bit lines. In this case, the word lines can be made so wide that the word line resistance remains low. Both in the case of the sixth layout variant and in the case of the seventh layout variant, the distance between the silicon needles and adjacent silicon needles is sufficiently large such that only slight parasitic currents occur. The latter can be suppressed by suitably arranged insulating trenches below the word line plane. In particular, it is also possible for the isolation trenches 170, 173 in FIG. 20A and the isolation trenches 183, 184 in FIG. 21A to be etched more deeply than described hitherto. Thus, unlike the case hitherto, the covering oxide layer 25 in FIGS. 12 and 14, respectively, does not serve as an etching stop, rather etching is effected beyond the covering oxide layer 25 into the depth. In this way, the isolation trenches for word line separation may simultaneously serve as insulating trenches for avoiding parasitic currents.

We claim:

1. A memory cell, comprising:
a substrate formed with a substantially rectangular trench hole defining a lower region and an upper region, and a horizontal bit line extending in a bit line direction;
a trench capacitor formed at said lower region of said trench hole, said trench capacitor having:
an inner capacitor electrode formed within said trench hole,
an outer capacitor electrode formed outside said trench hole; and
a dielectric layer between said inner capacitor electrode and said outer capacitor electrode;
a vertical selection transistor formed at said upper region of said trench hole, said selection transistor having:
a first source/drain electrode connected to said inner capacitor electrode of said trench capacitor;
a second source/drain electrode connected to said horizontal bit line; and
a vertically running channel region between said first source/drain electrode and said second source/drain electrode;
a horizontally running word line with gate region laterally adjoining said channel region, partially or completely enclosing said channel region, and being electrically insulated therefrom, said horizontally running word line with gate region being formed perpendicular to said bit line running horizontally thereabove, and an extent of said trench hole in a word line direction being at least 1.5 times as large as an extent of the trench hole in the bit line direction;
said vertically running channel region of said selection transistor extending through said horizontally running word line with gate region to said bit line above said channel region.

2. The memory cell according to claim 1, wherein the extent of said trench hole in the word line direction is 2 to 3.5 times as large as a minimum resolution width F of a lithographic process employed for fabricating the memory cell and the extent of said trench hole in the bit line direction approximately corresponds to the minimum resolution width F.

3. A memory cell, comprising:
a substrate formed with a substantially rectangular trench hole defining a lower region and an upper region, and a horizontal bit line extending in a bit line direction;
a trench capacitor formed at said lower region of said trench hole, said trench capacitor having:
an inner capacitor electrode formed within said trench hole,
an outer capacitor electrode formed outside said trench hole; and
a dielectric layer between said inner capacitor electrode and said outer capacitor electrode;
a vertical selection transistor formed at said upper region of said trench hole, said selection transistor having:
a first source/drain electrode connected to said inner capacitor electrode of said trench capacitor;
a second source/drain electrode connected to said horizontal bit line; and
a vertically running channel region between said first source/drain electrode and said second source/drain electrode;
a horizontally running word line with gate region laterally adjoining said channel region, partially or completely enclosing said channel region, and being electrically insulated therefrom;
said vertically running channel region of said selection transistor extending through said horizontally running word line with gate region to said bit line above said channel region, wherein a cross-sectional area of said channel region amounts to between 0.5 F×1 F and 1 F×1 F, where F denotes a minimum resolution width of a lithographic process employed for fabricating the memory cell.

4. A memory cell array, comprising:
a plurality of mutually parallel word lines, and a plurality of mutually parallel bit lines forming respective crossover points with said word lines;
a multiplicity of memory cells each comprising:
a substrate formed with a substantially rectangular trench hole defining a lower region and an upper region, and a horizontal bit line extending in a bit line direction;
a trench capacitor formed at said lower region of said trench hole, said trench capacitor having:
an inner capacitor electrode formed within said trench hole,
an outer capacitor electrode formed outside said trench hole; and
a dielectric layer between said inner capacitor electrode and said outer capacitor electrode;
a vertical selection transistor formed at said upper region of said trench hole, said selection transistor having:
a first source/drain electrode connected to said inner capacitor electrode of said trench capacitor;
a second source/drain electrode connected to said horizontal bit line; and
a vertically running channel region between said first source/drain electrode and said second source/drain electrode;
a horizontally running word line with gate region laterally adjoining said channel region, partially or completely enclosing said channel region, and being electrically insulated therefrom;
said vertically running channel region of said selection transistor extending through said horizontally running word line with gate region to said bit line above said channel region regularly arranged at said crossover points of said word lines and said bit lines, with said memory cells at mutually adjacent bit line rows being disposed offset relative to one another.

5. The memory cell array according to claim 4, wherein said channel regions of said memory cells of adjacent bit line rows, as seen in a bit line direction, adjoin associated said trench holes on mutually opposite longitudinal sides.

6. The memory cell array according to claim 4, wherein said channel regions of said memory cells, as seen in a word line direction, adjoin associated said trench holes at the same end side.

7. The memory cell array according to claim 4, wherein said channel regions of said memory cells of adjacent bit line rows, as seen in a word line direction, adjoin associated said trench holes on mutually opposite end sides.

8. The memory cell array according to claim 4, wherein said mutually parallel bit lines are folded bit lines, and a potential of an adjacent bit line is in each case used as reference potential for a memory cell read-out operation.

9. The memory cell array according to claim 4, wherein said mutually parallel bit lines are unfolded bit lines, and an external potential is in each case used as reference potential for a memory cell read-out operation.

10. The memory cell array according to claim 4, which comprises isolation trenches insulating mutually adjacent word lines from one another.

11. The memory cell array according to claim 10, wherein said isolation trenches have a width smaller than a minimum resolution width F of a lithographic process employed in fabricating the memory cell array.

12. The memory cell array according to claim 4, wherein a base area of a memory cell amounts to 2 F×4 F, where F denotes a minimum resolution width F of a lithographic process employed in fabricating said memory cells.

13. The memory cell array according to claim 4, wherein a base area of a memory cell amounts to 2.25 F×4 F, where F denotes a minimum resolution width F of a lithographic process employed in fabricating said memory cells.

14. The memory cell array according to claim 4, wherein said channel regions of said memory cells, as seen in a bit line direction, adjoin associated said trench holes on the same longitudinal side.

15. A memory cell array, comprising:
a plurality of mutually parallel word lines, and a plurality of mutually parallel bit lines forming respective crossover points with said word lines;
a multiplicity of memory cells each comprising:
a substrate formed with a substantially rectangular trench hole defining a lower region and an upper region, and a horizontal bit line extending in a bit line direction;
a trench capacitor formed at said lower region of said trench hole, said trench capacitor having:
an inner capacitor electrode formed within said trench hole,
an outer capacitor electrode formed outside said trench hole; and
a dielectric layer between said inner capacitor electrode and said outer capacitor electrode;
a vertical selection transistor formed at said upper region of said trench hole, said selection translator having:
a first source/drain electrode connected to said inner capacitor electrode of said trench capacitor;
a second source/drain electrode connected to said horizontal bit line; and
a vertically running channel region between said first source/drain electrode and said second source/drain electrode;
a horizontally running word line with gate region laterally adjoining said channel region, partially or completely enclosing said channel region, and being electrically insulated therefrom;
said vertically running channel region of said selection transistor extending through said horizontally running word line with gate region to said bit line above said channel region regularly arranged at said crossover points of said word lines and said bit lines, with said memory cells disposed in pairs offset relative to a respective memory cell pair of an adjacent bit line row.

16. The memory cell array according to claim 15, wherein said channel regions of said memory cells, as seen in a bit line direction, adjoin associated said trench holes on the same longitudinal side.

17. The memory cell array according to claim 15, wherein said channel regions of said memory cells of adjacent bit line rows, as seen in a bit line direction, adjoin associated said trench holes on mutually opposite longitudinal sides.

18. The memory cell array according to claim 15, wherein said channel regions of said memory cells, as seen in a word line direction, adjoin associated said trench holes at the same end side.

19. The memory cell array according to claim 15, wherein said channel regions of said memory cells of adjacent bit line rows, as seen in a word line direction, adjoin associated said trench holes on mutually opposite end sides.

20. The memory cell array according to claim 15, wherein said mutually parallel bit lines are folded bit lines, and a potential of an adjacent bit line is in each case used as reference potential for a memory cell read-out operation.

21. The memory cell array according to claim 15, wherein said mutually parallel bit lines are unfolded bit lines, and an external potential is in each case used as reference potential for a memory cell read-out operation.

22. The memory cell array according to claim 15, which comprises isolation trenches insulating mutually adjacent word lines from one another.

23. The memory cell array according to claim 22, wherein said isolation trenches have a width smaller than a minimum resolution width F of a lithographic process employed in fabricating the memory cell array.

24. The memory cell array according to claim 15, wherein a base area of a memory cell amounts to 2 F×4 F, where F denotes a minimum resolution width F of a lithographic process employed in fabricating said memory cells.

25. The memory cell array according to claim 15, wherein a base area of a memory cell amounts to 2.25 F×4 F, where F denotes a minimum resolution width F of a lithographic process employed in fabricating said memory cells.

* * * * *